United States Patent
Van Zwet

(10) Patent No.: US 11,953,835 B2
(45) Date of Patent: Apr. 9, 2024

(54) METHODS AND SYSTEMS FOR MASKLESS LITHOGRAPHY

(71) Applicant: ASML NETHERLANDS B.V., Veldhoven (NL)

(72) Inventor: Erwin John Van Zwet, Pijnacker (NL)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

(21) Appl. No.: 17/793,726

(22) PCT Filed: Dec. 28, 2020

(86) PCT No.: PCT/EP2020/087921
§ 371 (c)(1),
(2) Date: Jul. 19, 2022

(87) PCT Pub. No.: WO2021/155994
PCT Pub. Date: Aug. 12, 2021

(65) Prior Publication Data
US 2023/0061967 A1    Mar. 2, 2023

(30) Foreign Application Priority Data
Feb. 7, 2020    (EP) .................................... 20156258

(51) Int. Cl.
*G03F 7/00*    (2006.01)
(52) U.S. Cl.
CPC ................ *G03F 7/70558* (2013.01)
(58) Field of Classification Search
CPC .................... G03F 7/70291; G03F 7/70516
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| TW | I613532 | 2/2018 |
| TW | 201830167 | 8/2018 |

(Continued)

OTHER PUBLICATIONS

International Search Report and Written Opinion issued in corresponding PCT Patent Application No. PCT/EP2020/087921, dated Apr. 21, 2021.

(Continued)

*Primary Examiner* — Steven Whitesell Gordon
(74) *Attorney, Agent, or Firm* — Pillsbury Winthrop Shaw Pittman, LLP

(57) ABSTRACT

Method of exposing a substrate by a patterned radiation beam, comprising: —providing a radiation beam; —imparting the radiation beam by an array of individually controllable elements; —generating, from the radiation beam, a patterned radiation beam, by tilting the individually controllable elements between different positions about a tilting axis; —projecting the patterned radiation beam towards a substrate; —scanning a substrate across the patterned radiation beam in a scanning direction so as to expose the substrate to the patterned radiation beam, whereby the tilting axis of the individually controllable elements is substantially perpendicular to the scanning direction.

20 Claims, 15 Drawing Sheets

(56) References Cited

U.S. PATENT DOCUMENTS

| | | | |
|---|---|---|---|
| 5,523,193 A | | 6/1996 | Nelson |
| 6,262,829 B1 * | | 7/2001 | Kuramoto ................ G09G 3/34 359/566 |
| 6,312,134 B1 | | 11/2001 | Jain et al. |
| 2005/0094245 A1 * | | 5/2005 | Cebuhar ............. G03F 7/70208 359/291 |
| 2005/0274911 A1 * | | 12/2005 | Aloni .................. G03F 7/70375 250/492.22 |
| 2009/0122381 A1 * | | 5/2009 | Owa .................. G02B 26/0841 310/317 |
| 2011/0188016 A1 | | 8/2011 | De Jager et al. |
| 2011/0267594 A1 | | 11/2011 | Kim et al. |

FOREIGN PATENT DOCUMENTS

| | | |
|---|---|---|
| TW | I632432 | 8/2018 |
| TW | I640839 | 11/2018 |
| TW | I644183 | 12/2018 |
| TW | 202001632 | 1/2020 |
| TW | 202004363 | 1/2020 |
| WO | 98/33096 | 7/1998 |
| WO | 98/38597 | 9/1998 |
| WO | 2010032224 | 3/2010 |

OTHER PUBLICATIONS

Taiwanese Office Action issued in corresponding Taiwanese Patent Application No. 110101244, dated Oct. 6, 2021.

* cited by examiner

METHODS AND SYSTEMS FOR MASKLESS LITHOGRAPHY

CROSS-REFERENCE TO RELATED APPLICATIONS

This application is the U.S. national phase entry of PCT Patent Application No. PCT/EP2020/087921, which was filed on Dec. 28, 2020, which claims the benefit of priority of European Patent Application No. 20156258.4 which was filed on Feb. 7, 2020 and which is incorporated herein in its entirely by reference.

FIELD

The present disclosure relates to methods and systems for maskless lithography.

BACKGROUND

A lithographic apparatus is a machine that applies a desired pattern onto a substrate or part of a substrate. A lithographic apparatus may be used, for example, in the manufacture of integrated circuits (ICs), flat panel displays, and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may be transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually addressable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually addressable elements. Types of programmable patterning devices include micro-mirror arrays, liquid crystal display (LCD) arrays, grating light valve arrays, and the like.

SUMMARY

It is desirable, to improve the performance of lithographical apparatuses that include a programmable patterning device instead of a mask or reticle.

According to an aspect of the invention, there is provided a method of exposing a substrate by a patterned radiation beam, comprising:
  providing a radiation beam;
  imparting the radiation beam by an array of individually controllable elements;
  generating, from the radiation beam, a patterned radiation beam, by tilting the individually controllable elements between different positions about a tilting axis;
  projecting the patterned radiation beam towards a substrate;
  scanning a substrate across the patterned radiation beam in a scanning direction so as to expose the substrate to the patterned radiation beam, whereby the tilting axis of the individually controllable elements is substantially perpendicular to the scanning direction.

According to another aspect of the invention, there is provided a system for projecting a patterned radiation beam onto a substrate, the system comprising:
  an array of individually controllable elements, the array being configured to impart a radiation beam so as to generate a patterned radiation beam by tilting the individually controllable elements between different positions about a tilting axis;
  a stage apparatus configured to hold a substrate and configured to scan a substrate across the patterned radiation beam in a scanning direction so as to expose the substrate to the patterned radiation beam,
  and whereby the tilting axis of the individually controllable elements is substantially perpendicular to the scanning direction.

According to another aspect of the invention, there is provided a system for projecting a patterned radiation beam onto a substrate, the system comprising:
  an array of individually controllable elements, the array being configured to impart a radiation beam so as to generate a patterned radiation beam by tilting the individually controllable elements between different positions about a tilting axis;
  a stage apparatus configured to hold a substrate and configured to scan a substrate across the patterned radiation beam in a scanning direction so as to expose the substrate to the patterned radiation beam,
  a projection system comprising a microlens array, the microlens array being configured to:
    project a first two-dimensional pattern of radiation spots and a first two-dimensional pattern of radiation spots onto the substrate,
    whereby a width of the first two-dimensional pattern in a direction perpendicular to the scanning direction substantially corresponds to a width of the second two-dimensional pattern in a direction perpendicular to the scanning direction,
    whereby a length of the first two-dimensional pattern in the scanning direction substantially corresponds to a length of the second two-dimensional pattern in the scanning direction, and wherein the first two-dimensional pattern and the second two-dimensional pattern are spaced apart from each other in the scanning direction.

According to another aspect of the invention, there is provided a method of controlling a dose of radiation applied to a substrate, the method comprising:
  modulating a radiation beam according to a predetermined profile over time, the profile comprising a plurality of different intensity levels of the radiation beam;
  imparting the modulated radiation beam with an array of individually controllable elements so as to generate a patterned modulated radiation beam by tilting the individually controllable elements between different positions about a tilting axis;
  projecting the patterned modulated radiation beam towards a substrate;
  scanning a substrate across the patterned radiation beam in a scanning direction so as to expose the substrate to the patterned radiation beam, thereby exposing a portion of the substrate to the patterned modulated radiation beam;

wherein the step of imparting the modulated radiation beam comprises:
determining, based on a required dose of radiation for the portion of the substrate and on the predetermined profile over time, a tilting sequence of an element of the array of controllable elements, so as to expose the portion of the substrate to a selection of the plurality of different intensity levels.

According to another aspect of the invention, there is provided a system for projecting a patterned radiation beam onto a substrate, the system comprising:
an array of individually controllable elements, the array being configured to impart a radiation beam so as to generate a patterned radiation beam by tilting the individually controllable elements between different positions about a tilting axis;
a radiation beam modulator configured to modulate a radiation beam according to a predetermined profile over time, the profile comprising a plurality of different intensity levels of the radiation beam;
wherein the array of individually controllable elements is configured to impart the modulated radiation beam so as to generate a patterned modulated radiation beam by tilting the individually controllable elements between different positions about a tilting axis, wherein the system further comprises:
a stage apparatus configured to hold a substrate and configured to scan a substrate across the patterned modulated radiation beam in a scanning direction so as to expose the substrate to the patterned radiation beam, thereby exposing a portion of the substrate to the patterned modulated radiation beam,
a control unit, the control unit being configured to determine, based on a required dose of radiation for the portion of the substrate and on the predetermined profile over time, a tilting sequence of an element of the array of controllable elements, so as to expose the portion of the substrate to a selection of the plurality of different intensity levels.

According to another aspect of the invention, there is provided a system for projecting a patterned radiation beam onto a substrate, the system comprising:
an array of individually controllable elements, the array being configured to impart a radiation beam so as to generate a patterned radiation beam by tilting the individually controllable elements between different positions about a tilting axis;
a stage apparatus configured to hold a substrate and configured to scan a substrate across the patterned radiation beam in a scanning direction so as to expose the substrate to the patterned radiation beam,
a projection system configured to receive the patterned radiation beam, the projection system comprising:
a first microlens array
a second microlens array,
a pinhole array;
wherein the first microlens array is configured to receive the patterned radiation beam and project the patterned radiation beam onto the second microlens array, the second microlens array being configured to project the received patterned radiation beam onto the substrate, wherein the pinhole array is arranged in an optical path of the patterned radiation beam between the first microlens array and the second microlens array, and wherein the pinhole array is configured to limit cross-talk between adjacent radiation spots projected onto the substrate.

BRIEF DESCRIPTION OF THE DRAWINGS

The accompanying drawings, which are incorporated herein and form a part of the specification, illustrate embodiments of an invention and, together with the description, further serve to explain the principles of embodiments of the invention and to enable a person skilled in the pertinent art to make and use the embodiments.

One or more embodiments will now be described with reference to the accompanying drawings. In the drawings, like reference numbers may indicate identical or functionally similar elements.

DETAILED DESCRIPTION

Various embodiments of systems for use in a lithographic apparatus, in particular a maskless lithographic apparatus, methods for controlling a dose of radiation applied to a substrate, and lithographic apparatuses are described herein. As it is maskless, no conventional mask is needed to expose, for example, ICs or flat panel displays.

In an embodiment, the lithographic apparatus is highly flexible. In an embodiment, the lithographic apparatus is scalable to substrates of different sizes, types and characteristics. Thus, the lithographic apparatus can enable multiple applications (e.g., IC, flat panel display, packaging, etc.) with a single lithographic apparatus or using multiple lithographic apparatus using a largely common lithographic apparatus platform.

Figure 1:
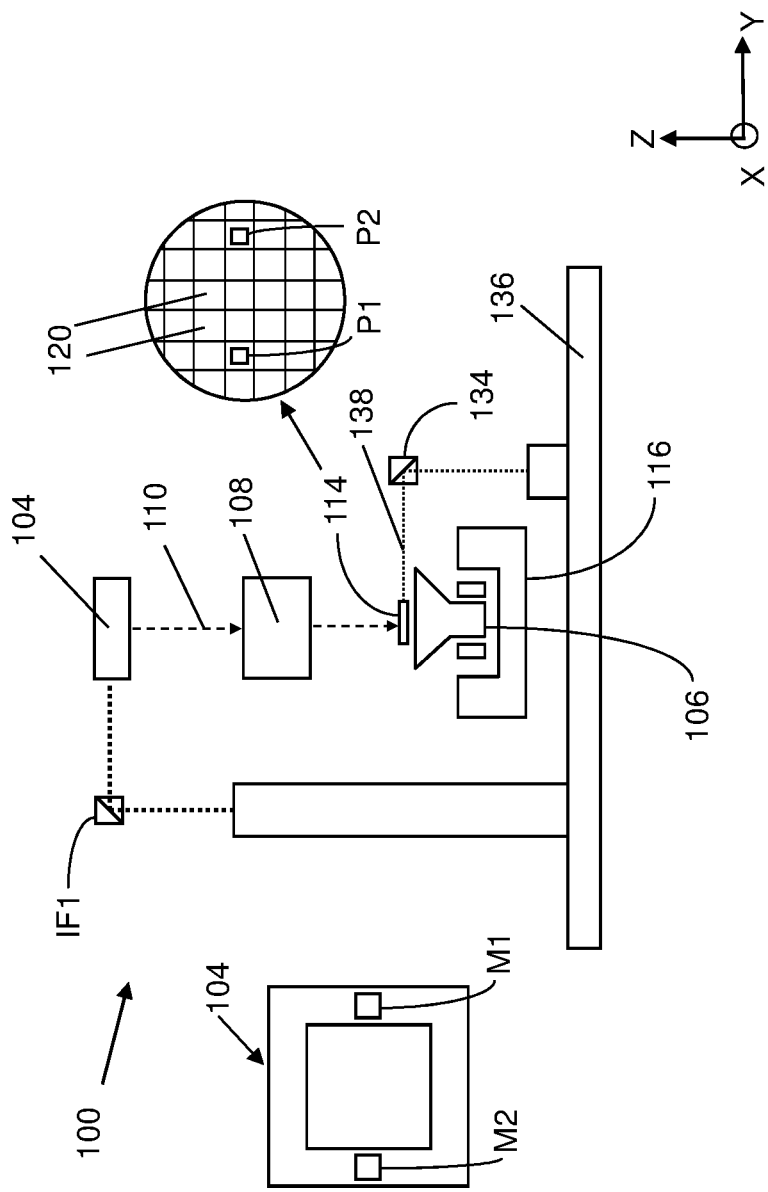
FIG. 1 depicts a schematic side view of a part of a lithographic apparatus according to an embodiment.

FIG. 1 schematically depicts a part of a lithographic projection apparatus 100 according to an embodiment. Apparatus 100 includes a patterning device 104, an object holder 106 (e.g., an object table, for instance a substrate table), and a projection system 108.

In an embodiment, the patterning device 104 comprises a plurality of individually addressable elements 102 to modulate radiation to apply a pattern to beam 110. In an embodiment, the position of the plurality of individually addressable or controllable elements 102 can be fixed relative to projection system 108. However, in an alternative arrangement, a plurality of individually addressable or controllable elements 102 may be connected to a positioning device (not shown) to accurately position one or more of them in accordance with certain parameters (e.g., with respect to projection system 108). In an embodiment, the plurality of individually controllable elements are arranged in an array, e.g. a two-dimensional array. In an embodiment, the individually controllable elements are reflective elements such as mirrors. In accordance with the present invention, the patterning device may be configured to impart a radiation beam, e.g. provided by a radiation source, so as to generate a patterned radiation beam. In an embodiment, the patterning device 104 can comprise a programmable mirror array, whereby a position of the individual mirrors of the programmable mirror array can be controlled. In particular, an orientation of the individual mirrors of the programmable mirror array, in general the patterning device, can be adjusted by tilting the individual mirrors.

The lithographic apparatus 100 comprises an object holder 106. In this embodiment, the object holder comprises an object table 106 to hold a substrate 114 (e.g., a resist-coated silicon wafer or glass substrate). The object table 106 may be movable in up to 6 degrees of freedom (e.g., in at X and/or Y directions) and be connected to a positioning device 116 to accurately position substrate 114 in accordance with certain parameters. For example, a positioning device 116 may accurately position substrate 114 with respect to projection system 108 and/or the patterning device 104. In an embodiment, movement of object table 106 may be realized with the positioning device 116 comprising a long-stroke module (coarse positioning) and optionally a short-stroke module (fine positioning), which are not explicitly depicted in FIG. 1. A similar system may be used to position the individually addressable elements 102, such that, for example, the individually addressable elements 102 can be moved in up to 6 degrees of freedom (e.g., in at X and/or Y directions), e.g., scan in a direction substantially parallel with a scanning direction of the object table 106 and optionally step in an orthogonal direction to the scanning direction. Beam 110 may alternatively/additionally be moveable, while the object table 106 and/or the individually addressable elements 102 may have a fixed position to provide the required relative movement. Such an arrangement may assist in limiting the size of the apparatus.

In an embodiment, which may e.g. be applicable in the manufacture of flat panel displays, the object table 106 may be stationary and positioning device 116 is configured to move substrate 114 relative to (e.g., over) object table 106. For example, the object table 106 may be provided with a system to scan the substrate 114 across it at a substantially constant velocity. Where this is done, object table 106 may be provided with a multitude of openings on a flat uppermost surface, gas being fed through the openings to provide a gas cushion which is capable of supporting substrate 114. This is conventionally referred to as a gas bearing arrangement. Substrate 114 is moved over object table 106 using one or more actuators (not shown), which are capable of accurately positioning substrate 114 with respect to the path of beam 110. Alternatively, substrate 114 may be moved with respect to the object table 106 by selectively starting and stopping the passage of gas through the openings. In an embodiment, the object holder 106 can be a roll system onto which a substrate is rolled and positioning device 116 may be a motor to turn the roll system to provide the substrate onto an object table 106.

In an embodiment, the lithographic apparatus according to the present invention comprises a projection system 108 (e.g., a quartz, glass, plastic (e.g., COC) and/or $CaF_2$ lens system or optical element, or a catadioptric system comprising lens elements made from such materials, or a mirror system, or an optical element (e.g., glass element) with an additional layer of polymer, or an optical element comprising a flat surface and a spherical surface, which can be modified to an aspherical surface using, e.g., a polymer layer, etc.) can be used to project the patterned beam modulated by the individually addressable elements 102 onto a target portion 120 (e.g., one or more dies) of substrate 114. Projection system 108 may image the pattern provided by the plurality of individually addressable elements 102 such that the pattern is coherently formed on the substrate 114. Alternatively, projection system 108 may project images of secondary sources for which the elements of the plurality of individually addressable elements 102 act as shutters.

In this respect, the projection system may comprise a focusing element, or a plurality of focusing elements (herein referred to generically as a lens array) e.g., a micro-lens array (known as an MLA) or a Fresnel lens array, e.g. to form the secondary sources and to image spots onto the substrate 114. In an embodiment, the lens array (e.g., MLA) comprises at least 10 focusing elements, e.g. at least 100 focusing elements, at least 1,000 focusing elements, at least 10,000 focusing elements, at least 100,000 focusing elements, or at least 1,000,000 focusing elements. In an embodiment, the number of individually addressable elements in the patterning device is equal to or greater than the number of focusing elements in the lens array. In an embodiment, the lens array comprises a plurality of focusing elements, at least one focusing element is optically associated with one or more of the individually addressable elements in the array of individually addressable elements, e.g. with only one of the individually addressable elements in the array of individually addressable elements, or with 2 or more of the individually addressable elements in the array of individually addressable elements, e.g., 3 or more, 5 or more, 10 or more, 20 or more, 25 or more, 35 or more, or 50 or more; in an embodiment, at least one focusing element of the plurality of optical elements is optically associated with less than 5,000 individually addressable elements, e.g. less than 2,500, less than 1,000, less than 500, or less than 100.

In an embodiment, the lens array comprises two or more focusing elements (e.g. more than 1,000, the majority, or about all) that are each optically associated with a plurality of individually addressable elements in a two-dimensional array.

In an embodiment, the patterning device 104 is movable at least in the direction to and away from the substrate, e.g. with the use of one or more actuators. Being able to move the patterning device to and away from the substrate allows, e.g., for focus adjustment without moving the substrate or the lens array (e.g. for local focus adjustments on non-flat substrates).

In an embodiment, the lens array comprises plastic focusing elements (which may be easy to make, e.g. injection molding, and/or affordable), where, for example, the wavelength of the radiation is greater than or equal to about 400 nm (e.g. 405 nm). In an embodiment, the wavelength of the radiation is selected from the range of about 350 nm-500 nm, e.g., the range of about 375-425 nm. In an embodiment, the lens array comprises quartz or glass focusing elements.

In an embodiment, each or a plurality of the focusing elements may be an asymmetrical lens (e.g., having one or more asymmetric surfaces). The asymmetry may be the same for each of the plurality of focusing elements or may be different for one or more focusing elements of a plurality of focusing elements than for one or more different focusing elements of a plurality of focusing elements. An asymmetrical lens may facilitate converting an oval radiation output into a circular projected spot, or vice versa.

In an embodiment, the focusing element has a high numerical aperture (NA) that is arranged to project radiation onto the substrate out of the focal point to obtain a low NA for the system. A higher NA lens may be more economic, prevalent and/or better quality than an available low NA lens. In an embodiment, low NA is less than or equal to 0.3, in an embodiment 0.18, 0.15 or less. Accordingly, a higher NA lens has a NA greater than the design NA for the system, for example, greater than 0.3, greater than 0.18, or greater than 0.15.

While, in an embodiment, the projection system 108 is separate from the patterning device 104, it need not be. The projection system 108 may be integral with the patterning device 108. For example, a lens array block or plate may be attached to (integral with) a patterning device 104. In an embodiment, the lens array may be in the form of individual spatially separated lenslets, each lenslet attached to (integral with) one or more individually addressable elements of the patterning device 104 as discussed in more detail below.

Optionally, the lithographic apparatus may comprise a radiation system to supply radiation (e.g., ultraviolet (UV) radiation) to the plurality of individually addressable elements 102. In an embodiment, such a radiation system includes an illumination system (illuminator) configured to receive radiation from a radiation source. The illumination system includes one or more of the following elements: a radiation delivery system (e.g., suitable directing mirrors), a radiation conditioning device (e.g., a beam expander), an adjusting device to set the angular intensity distribution of the radiation (generally, at least the outer and/or inner radial extent (commonly referred to as σ-outer and σ-inner, respectively) of the intensity distribution in a pupil plane of the illuminator can be adjusted), an integrator, and/or a condenser. The illumination system may be used to condition the radiation that will be provided to the individually addressable elements 102 to have a desired uniformity and intensity distribution in its cross-section. The illumination system may be arranged to divide radiation into a plurality of sub-beams that may, for example, each be associated with one or more of the plurality of the individually addressable elements. A two-dimensional diffraction grating may, for example, be used to divide the radiation into sub-beams. In the present description, the terms "beam of radiation" and "radiation beam" encompass, but are not limited to, the situation in which the beam is comprised of a plurality of such sub-beams of radiation.

The radiation system may also include a radiation source (e.g., an excimer laser) to produce the radiation for supply to or by the plurality of individually addressable elements 102. The radiation source and the lithographic apparatus 100 may be separate entities, for example when the radiation source is an excimer laser. In such cases, the radiation source is not considered to form part of the lithographic apparatus 100 and the radiation is passed from the source to the illuminator. In other cases the radiation source may be an integral part of the lithographic apparatus 100, for example when the source is a mercury lamp.

In an embodiment, the radiation source, which in an embodiment may be the plurality of individually addressable elements 102, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365 nm, 405 nm and 436 nm. A 355 nm laser source could be used. In an embodiment, the radiation has a wavelength of about 405 nm.

In operation of the lithographic apparatus 100, radiation is incident on the patterning device 104 (e.g., a plurality of individually addressable elements) from a radiation system (illumination system and/or radiation source) and is modulated by the patterning device 104.

The patterned beam 110, after having been created by the plurality of individually addressable elements 102, passes through projection system 108, which focuses beam 110 onto a target portion 120 of the substrate 114.

With the aid of positioning device 116 (and optionally a position sensor 134 on a base 136 (e.g., an interferometric measuring device that receives an interferometric beam 138, a linear encoder or a capacitive sensor)), substrate 114 can be moved accurately, e.g., so as to position different target portions 120 in the path of beam 110. Where used, the positioning device for the plurality of individually addressable elements 102 can be used to accurately correct the position of the plurality of individually addressable elements 102 with respect to the path of beam 110, e.g., during a scan.

Although the lithography apparatus 100 according to an embodiment is described herein as being configured to expose a resist on a substrate, the apparatus 100 may be used to project a patterned beam 110 for use in resistless lithography.

The lithographic apparatus 100 may be of a reflective type (e.g. employing reflective individually addressable elements). Alternatively, the apparatus may be of a transmissive type (e.g. employing transmissive individually addressable elements).

The depicted apparatus 100 can be used in one or more modes, such as:

1. In step mode, the individually addressable elements 102 and the substrate 114 are kept essentially stationary, while an entire patterned radiation beam 110 is projected onto a target portion 120 at one go (i.e. a single static exposure). The substrate 114 is then shifted in the X- and/or Y-direction so that a different target portion 120 can be exposed to the patterned radiation beam 110. In step mode, the maximum size of the exposure field limits the size of the target portion 120 imaged in a single static exposure.

2. In scan mode, the individually addressable elements 102 and the substrate 114 are scanned synchronously while a pattern radiation beam 110 is projected onto a target portion 120 (i.e. a single dynamic exposure). The velocity and direction of the substrate relative to the individually addressable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion.

3. In pulse mode, the individually addressable elements 102 are kept essentially stationary and the entire pattern is projected onto a target portion 120 of the substrate 114 using pulsing (e.g., provided by a pulsed radiation source or by pulsing the individually addressable elements). The substrate 114 is moved with an essentially constant speed such that the patterned beam 110 is caused to scan a line across the substrate 114. The pattern provided by the individually addressable elements is updated as required between pulses and the pulses are timed such that successive target portions 120 are exposed at the required locations on the substrate 114. Consequently, patterned beam 110 can scan across the substrate 114 to expose the complete pattern for a strip of the substrate 114. The process is repeated until the complete substrate 114 has been exposed line by line.

4. In continuous scan mode, essentially the same as pulse mode except that the substrate 114 is scanned relative to the modulated beam of radiation B at a substantially constant speed and the pattern on the array of individually addressable elements is updated as the patterned beam 110 scans across the substrate 114 and exposes it. A substantially constant radiation source or a pulsed radiation source, synchronized to the updating of the pattern on the array of individually addressable elements may be used.

Combinations and/or variations on the above described modes of use or entirely different modes of use may also be employed.

Figure 2:
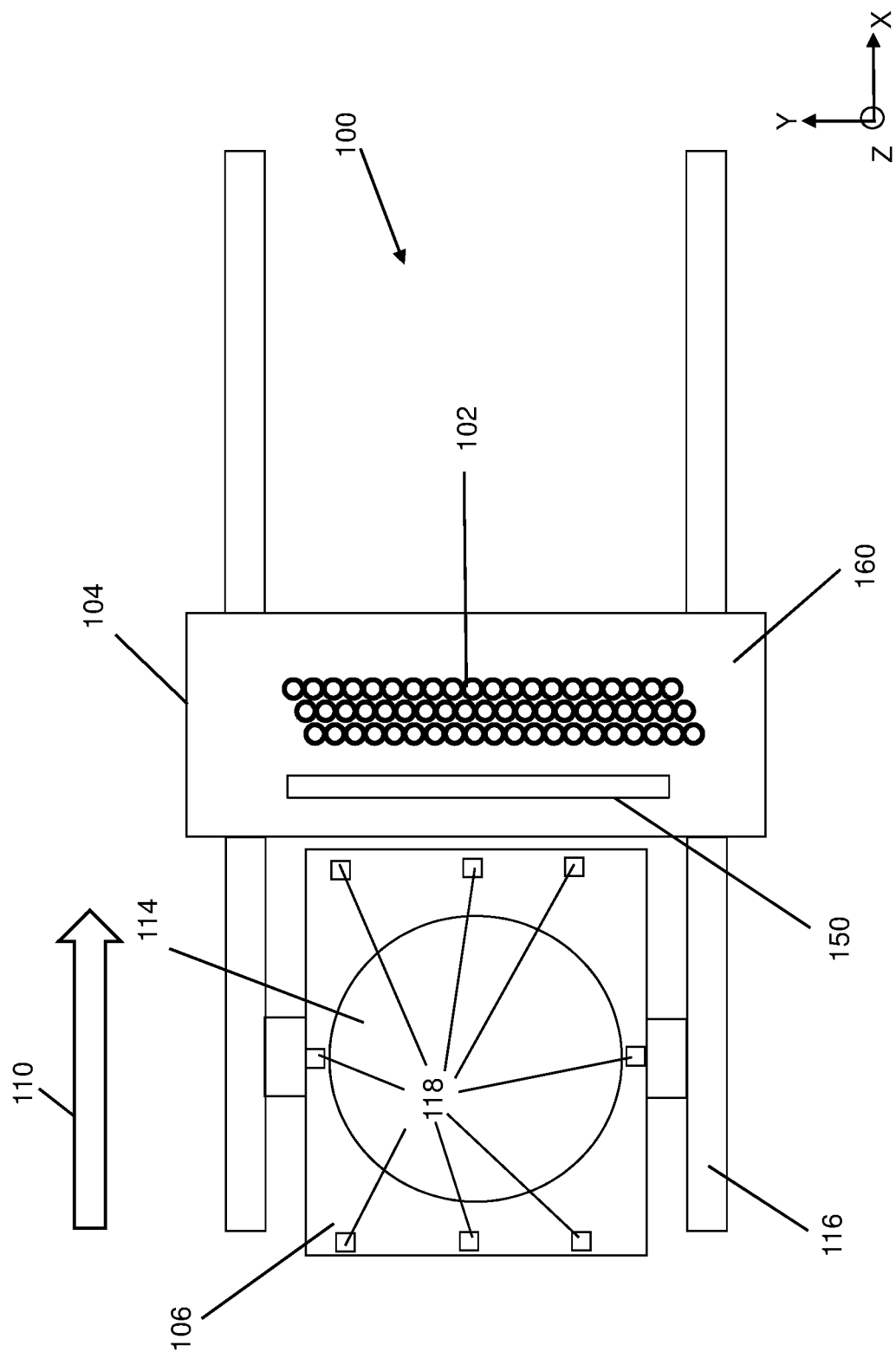
FIG. 2 depicts a schematic top view of a part of a lithographic apparatus according to an embodiment.

FIG. 2 depicts a schematic top view of a part of a lithographic apparatus according to an embodiment for use with substrates (e.g., 300 mm wafers). As shown in FIG. 2, the lithographic apparatus 100 comprises a substrate table 106 to hold a substrate 114. Associated with the substrate table 106 is a positioning device 116 to move the substrate table 106 in at least the X-direction as shown in arrow 123. Optionally, the positioning device 116 may move the substrate table 106 in the Y-direction and/or Z-direction. The positioning device 116 may also rotate the substrate table 106 about the X-, Y- and/or Z-directions. Accordingly, the positioning device 116 may provide motion in up to 6 degrees of freedom. In an embodiment, the substrate table 106 provides motion only in the X-direction, an advantage of which is lower costs and less complexity.

The lithographic apparatus 100 further comprises a plurality of individually addressable elements 102 arranged on a frame 160. Frame 160 may be mechanically isolated from the substrate table 106 and its positioning device 116. Mechanical isolation may be provided, for example, by connecting the frame 160 to ground or a firm base separately from the frame for the substrate table 106 and/or its positioning device 116. In addition or alternatively, dampers may be provided between frame 160 and the structure to which it is connected, whether that structure is ground, a firm base or a frame supporting the substrate table 106 and/or its positioning device 116.

In this embodiment, each of the individually addressable elements 102 is a radiation emitting diode, e.g., an LED. For the sake of simplicity, three rows of individually addressable elements 102 extending along the Y-direction (and spaced in the X-direction) are shown in FIG. 2, each row having, in this embodiment, sufficient columns to extend across the width of the substrate; a greater number of rows of individually addressable elements 102 may be arranged on the frame 160. In an embodiment, each of the individually addressable elements 102 is configured to provide a plurality of radiation beams. In an embodiment, each of the individually addressable elements 102 depicted in FIG. 2 comprises a plurality of individually addressable elements 102 (thus each circle labeled 102 in FIG. 2 represents a plurality of individually addressable elements 102). In an embodiment, one or more rows of individually addressable elements 102 are staggered in the Y-direction from an adjacent row of individually addressable elements 102 as shown in FIG. 2. In an embodiment, the individually addressable elements 102 are substantially stationary, i.e., they do not move significantly or at all during projection.

The lithographic apparatus 100, particularly the individually addressable elements 102, may be arranged to provide pixel-grid imaging as described in more detail herein. However, in an embodiment, the lithographic apparatus 100 need not provide pixel-grid imaging. Rather, the lithographic apparatus 100 may project the radiation of the individually addressable elements 102 onto the substrate in a manner that does not form individual pixels for projection onto the substrate but rather a substantially continuous image for projection onto the substrate.

Element 150 of lithographic apparatus 100 as depicted in FIG. 2 may comprise an alignment sensor, a level sensor, or both. For example, in an embodiment, the lithographic apparatus 100 comprises an alignment sensor 150. The alignment sensor is used to determine alignment between the substrate 114 and, for example, the individually addressable elements 102 before and/or during exposure of the substrate 114. The results of the alignment sensor 150 can be used by a controller of the lithographic apparatus 100 to control, for example, the positioning device 116 to position the substrate table 106 to improve alignment. In addition or alternatively, the controller may control, for example, responsive to a signal from sensor 150, a positioning device associated with the individually addressable elements 102 to position one or more of the individually addressable elements 102 (including, for example, positioning one or more of the elements 102 relative to one or more other elements 102) to improve alignment and/or, responsive to a signal from sensor 150, a deflector associated with the individually addressable elements 102 to position one or more of the beams (including, for example, positioning one or more of the beams relative to one or more other beams) to improve alignment. In an embodiment, the alignment sensor 150 may include pattern recognition functionality/software to perform alignment.

In an embodiment, the lithographic apparatus 100, in addition or alternatively, comprises a level sensor 150. The level sensor 150 is used to determine whether the substrate 106 is level with respect to the projection of the pattern from the individually addressable elements 102. The level sensor 150 can determine level before and/or during exposure of the substrate 114. The results of the level sensor 150 can be used by a controller of the lithographic apparatus 100 to control, for example, the positioning device 116 to position the substrate table 106 to improve leveling. In addition or alternatively, the controller may control, for example, responsive to a signal from sensor 150, a positioning device associated with a projection system 108 (e.g., a lens array) to position an element of the projection system 108 (e.g., a lens, or a smaller lens array, of a lens array, including, for example, positioning a lens, or a smaller lens array, of a lens array relative to another lens, or another smaller lens array, of the lens array) to improve leveling. In an embodiment, the level sensor may operate by projecting an ultrasonic beam at the substrate 106 and/or operate by projecting an electromagnetic beam of radiation at the substrate 106.

In an embodiment, results from the alignment sensor and/or the level sensor may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc. Thus, results from the alignment sensor and/or the level sensor can be used to alter the projected pattern to effect a non-linear distortion correction. Non-linear distortion correction may be useful, for example, for flexible displays, which may not have consistent linear or non-linear distortion.

In operation of the lithographic apparatus 100, a substrate 114 is loaded onto the substrate table 106 using, for example, a robot handler (not shown). The substrate 114 is then displaced in the X-direction as shown in the arrow 123 under the frame 160 and the individually addressable elements 102. The substrate 114 is measured by the level sensor and/or the alignment sensor 150 and then is exposed to a pattern using individually addressable elements 102. For example, the substrate 114 is scanned through the focal plane (image plane) of the projection system 108, while the substrate is moving and the individually addressable elements 102 are switched at least partially or fully "ON" or "OFF" in the patterning device 104. Features corresponding to the pattern of the patterning device 104 are formed on the substrate 114. In an embodiment, the substrate 114 may be scanned completely in the positive X-direction and then scanned completely in the negative X-direction. In such an embodiment, an additional level sensor and/or alignment sensor 150 on the opposite side of the individually addressable elements 102 may be required for the negative X-direction scan.

Figure 3:
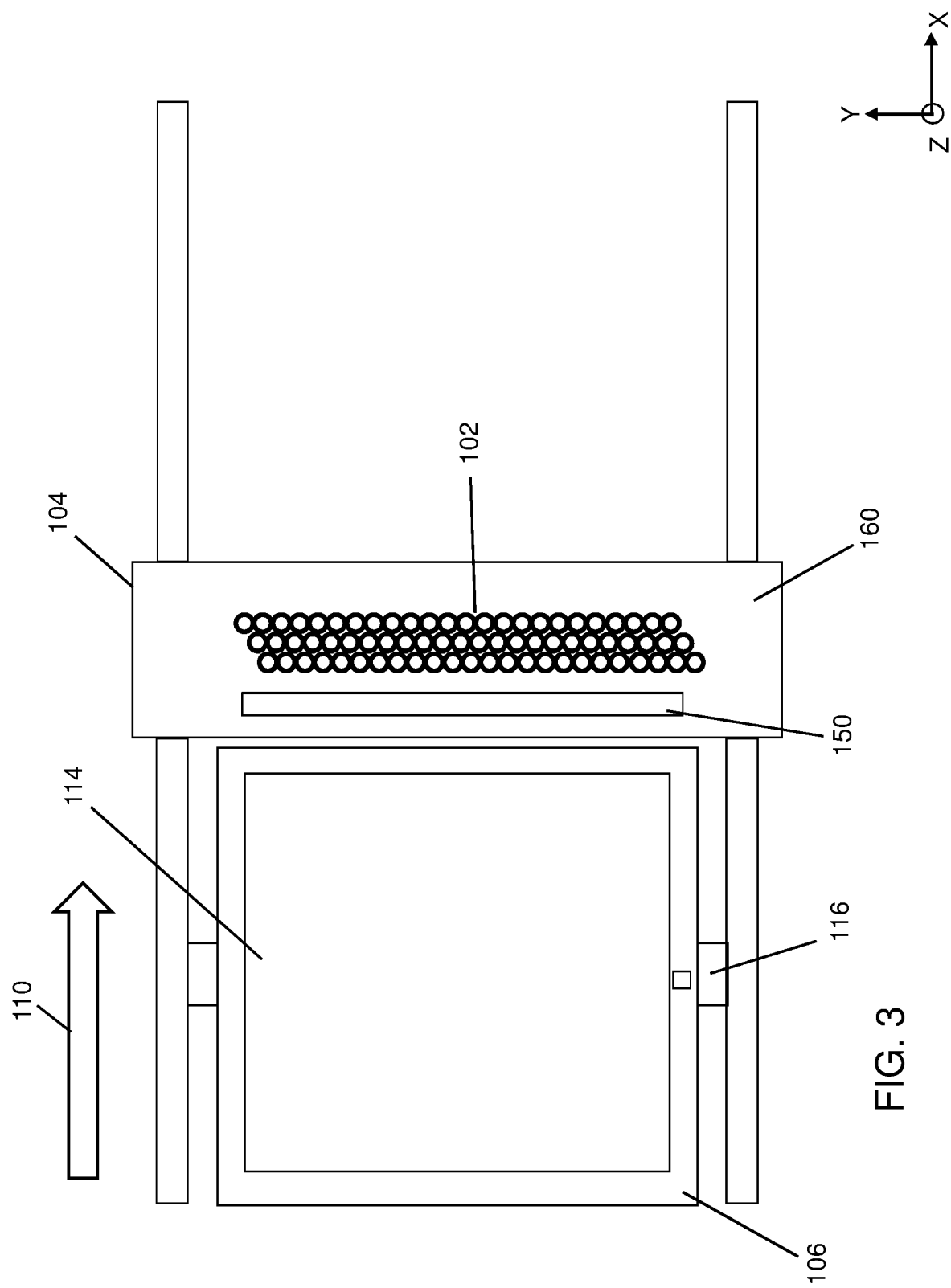
FIG. 3 depicts a schematic top view of a part of a lithographic apparatus according to an embodiment.

FIG. 3 depicts a schematic top view of a part of a lithographic apparatus according to an embodiment for exposing substrates in the manufacture of, for instance, flat panel displays (e.g., LCDs, OLED displays, etc.). Like the lithographic apparatus 100 shown in FIG. 2, the lithographic apparatus 100 comprises a substrate table 106 to hold a flat panel display substrate 114, a positioning device 116 to move the substrate table 106 in up to 6 degrees of freedom, an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus 100 further comprises a plurality of individually addressable elements 102 arranged on a frame 160. In this embodiment, each of the individually addressable elements 102 is a radiation emitting diode, e.g., an LED. For the sake of simplicity, three rows of individually addressable elements 102 extending along the Y-direction are shown in FIG. 3 and having sufficient columns to cover the width of the substrate; a greater number of rows of individually addressable elements 102 may be arranged on the frame 160. In an embodiment, each of the individually addressable elements 102 is configured to provide a plurality of radiation beams. In an embodiment, each of the individually addressable elements 102 depicted in FIG. 3 comprises a plurality of individually addressable elements 102 (thus each circle labeled 102 in FIG. 3 represents a plurality of individually addressable elements 102). Further, in an embodiment, a number of the rows of individually addressable elements 102 are staggered in the Y-direction from one or more adjacent rows of individually addressable elements 102 as shown in FIG. 3. The lithographic apparatus 100, particularly the individually addressable elements 102, may be arranged to provide pixel-grid imaging. In an embodiment, the individually addressable elements 102 are substantially stationary, i.e., they do not move significantly during projection.

In operation of the lithographic apparatus 100, a panel display substrate 114 is loaded onto the substrate table 106 using, for example, a robot handler (not shown). The substrate 114 is then displaced in the X-direction as shown in arrow 123 under the frame 160 and the individually addressable elements 102. The substrate 114 is measured by the level sensor and/or the alignment sensor 150 and then is exposed to a pattern using individually addressable elements 102. One or more lenses may be used to project the patterning beams from the individually addressable elements 102 to the substrate.

As discussed above, a plurality of individually addressable elements 102 are optically associated with a lens of projection system 108. In an embodiment, the patterning beams from the plurality of individually addressable elements 102 substantially cover the field of view of the associated lens of projection system 108. In an embodiment, a plurality of individually addressable elements 102 collectively forms a two-dimensional emitter array, each array associated with a single lens of projection system 108. And so, in an embodiment, there are provided a plurality of emitter arrays, each array associated with a single lens of a lens array (extending in the X-Y plane) of projection system 108. Thus, in an embodiment, a single lens forms all of, or part of, the projection system 108 for an array of individually addressable elements 102.

In conventional lithography, a mask or reticle is provided with a pattern that is to be projected onto a substrate. In such arrangement, the mask or reticle is used to impart a radiation beam so as to form a patterned radiation beam. By synchronously scanning the mask or reticle across the radiation beam and the substrate across the patterned radiation beam, the substrate is exposed to the pattern of the mask or reticle. In maskless lithography, a radiation beam is typically imparted by an array of individually controllable elements, e.g. individually controllable mirrors which can be tilted. By individually tilting the elements, a patterned radiation beam can be generated. A substrate can be scanned across such a patterned radiation beam. during such scanning, the pattern of the patterned radiation beam can be continuously adjusted so as to project a desired pattern onto the substrate.

The present invention provides various improvements for a maskless lithographic system or apparatus. Said improvements may e.g. be implemented in the lithographic apparatuses as described above.

According to a first aspect of the present invention, a system for use in a maskless lithographic apparatus is provided, the system comprising an array of individually controllable elements that is configured to impart a radiation beam so as to generate a patterned radiation beam by tilting the individually controllable elements between different positions about a tilting axis. Such an array of individually controllable elements may form part of a programmable mirror array or the like.

In such embodiment, the controllable elements may e.g. be mirrors.

In an embodiment, the array may e.g. be a two-dimensional array of mirrors which can be individually controlled. The system according to the first aspect of the present invention further comprises a stage apparatus configured to hold a substrate and configured to scan a substrate across the patterned radiation beam in a scanning direction so as to expose the substrate to the patterned radiation beam. In order to generate the patterned radiation beam, the controllable elements, e.g. the mirrors, can e.g. be controlled such that they can be positioned in two different positions. In such arrangement, the controllable elements can e.g. be brought in a first position or in a second position, whereby the elements, when in the first position, project a part or portion of the radiation beam towards the substrate or towards a projection system, and whereby the elements, when in the second position, project the part or portion away from the substrate or projection system. In such embodiment, the first position may be referred to as the "ON" position, whereas the second position may be referred to as the "OFF" position.

In general, the patterned radiation beam will, when projected onto the substrate, result in a pattern or radiation spots. In case of a two-dimensional array of controllable elements whereby all controllable elements are brought in the first position, this would result in a two-dimensional pattern of radiation spots on a substrate. Such a pattern is schematically shown in FIG. 4.

Figure 4:
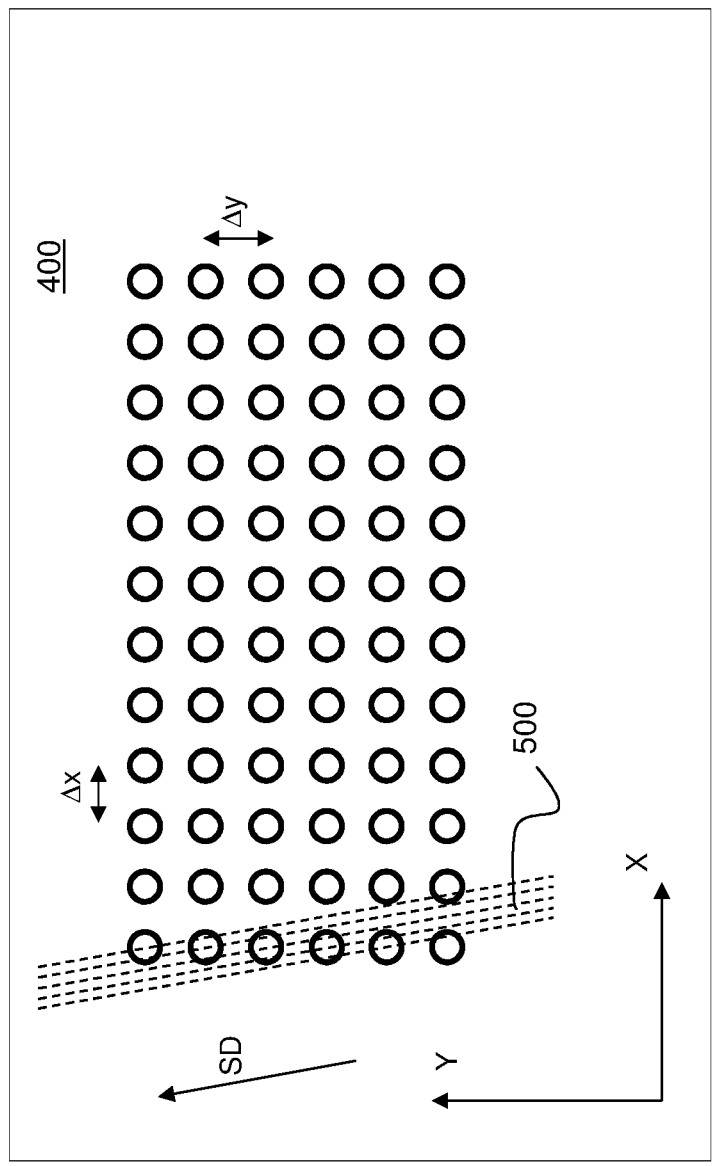
FIG. 4 schematically shows a two-dimensional pattern of radiation spots.

FIG. 4 schematically shows a two-dimensional pattern of radiation spots 400 that can e.g. be generated by positioning a two-dimensional array of controllable elements in the "ON" position and projecting the imparted radiation beam, e.g. via a projection system or lens, onto a substrate. Ideally, a regular grid pattern of radiation spots should be obtained, whereby a distance Δx between adjacent spots in the x-direction is equal for all spots and whereby a distance Δy between adjacent spots in the y-direction is equal for all spots. typically, the distances Δx and Δy between adjacent spots is larger than a diameter or cross-section of the radiation spots.

In order to be able to expose each portion or location of the substrate, the substrate can be displaced or scanned underneath the pattern of radiation spots in a direction that slightly deviates from the X-direction and Y-direction along which the radiation spots are oriented.

In particular, as illustrated in FIG. 4, based on the number of spots in the X-direction, the distance Δy between adjacent spots and the size of the spots, a scanning direction SD can be selected such that each portion or location is scanned by a radiation spot. In particular, in case the substrate is scanned along the direction SD relative to the array of radiation spots, the lines 500 indicate the trajectories of the radiation spots. As can be seen, by the selected scanning direction, the entire area of a substrate can be scanned. In particular, the scanning trajectories of the different radiation spots are such that a pattern without gaps in the X-direction is obtained when the substrate is scanned across the array of radiation spots 400. As will be appreciated by the skilled person, by coordinating and synchronising the position of the controllable elements, thereby controlling whether the elements are in the "ON" position or the "OFF" position, and the scanning movement of the substrate, one can irradiate the substrate with any arbitrary pattern in a maskless manner.

Figure 5:
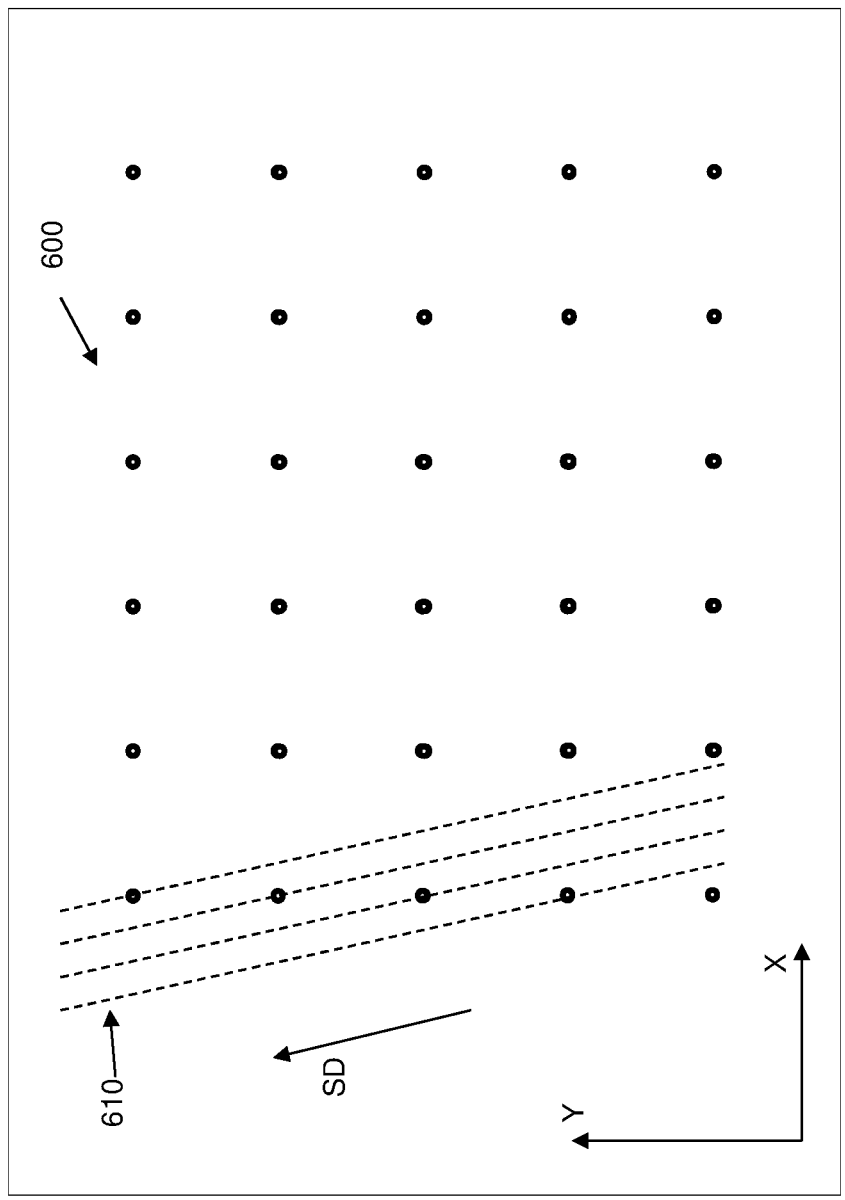
FIGS. 5 and 6 schematically show a regular and an irregular two-dimensional pattern of radiation spots.
Figure 6:
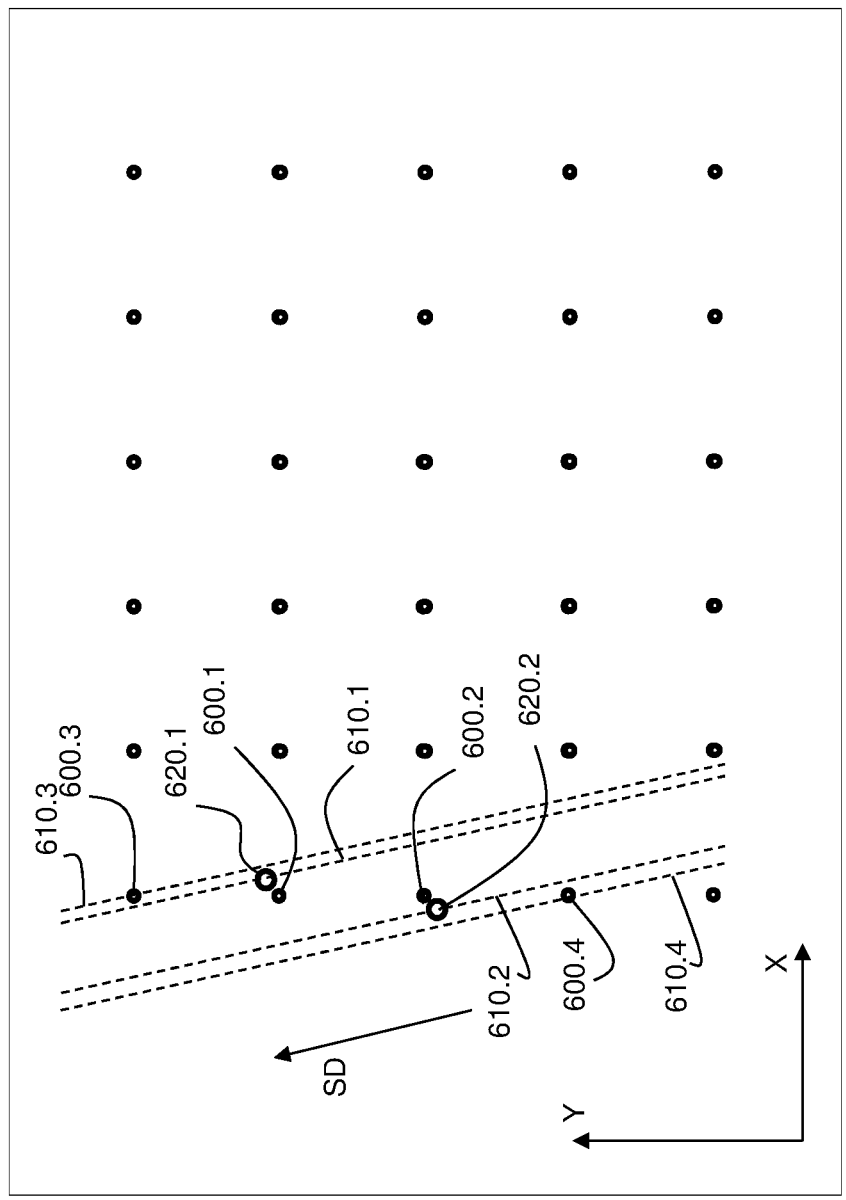

It has been observed by the inventor that in practice, the regular grid pattern of radiation spots may not be realised. Rather, it can be observed that in general the radiation spots may be displaced relative to the desired or expected regular grid pattern. FIGS. 5 and 6 schematically show the effect of irregular pattern of radiation spots. In particular, FIG. 5 schematically shows a detailed pattern of radiation spots 600 in a regular pattern, together with the corresponding trajectories 610 of the radiation spots 600 of the left row of spots along the scanning direction SD. FIG. 6 schematically shows the same pattern of radiation spots 600 as shown in FIG. 5, whereby two radiation spots of the left row are displaced relative to the desired position. In particular, the actual position of the radiation spot 600.1 is at the location indicate by the circle 620.1, whereas the actual position of the radiation spot 600.2 is at the location indicate by the circle 620.2. The radiation spot 600.1 is thus displaced towards the upper right corner of the array, whereas the radiation spot 600.1 has a deviating position towards the lower left corner of the array. As a result of these deviating positions, the trajectories of the radiation spots have displaced as well. In particular, the trajectory 610.1 of radiation spot 600.1 can be seen to have moved closer to the trajectory 610.3 of radiation spot 600.3, whereas the trajectory 610.2 of radiation spot 600.2 can be seen to have moved closer to the trajectory 610.4 of radiation spot 600.4. As a result, there will be an overlap in the area covered by the radiation spot 600.1 and the radiation spot 600.3 and an overlap in the area covered by the radiation spot 600.2 and the radiation spot 600.4, during a scanning operation along the direction SD. Such an overlap is undesired as it brings about an uncertainty for the actual radiation dose applied to a particular location. In addition, it can be pointed out that a gap has occurred between the trajectories of the radiation spots 600.1 and 600.2, resulting in an area which will not be covered by any radiation spot during a scanning operation along the direction SD. As a result, it may not be possible to expose the substrate to the desired irradiation pattern.

As illustrated in FIG. 6, the occurring deviations in the radiation spot positions of spots 600.1 and 600.2 have a component both in the indicated X-direction and in the indicated Y-direction, the Y-direction substantially corresponding to the scanning direction.

It has been devised that the occurring positional deviation can be attributed to the manner in which known arrays of the controllable elements, e.g. programmable mirror arrays or the like, are constructed.

Figure 7:
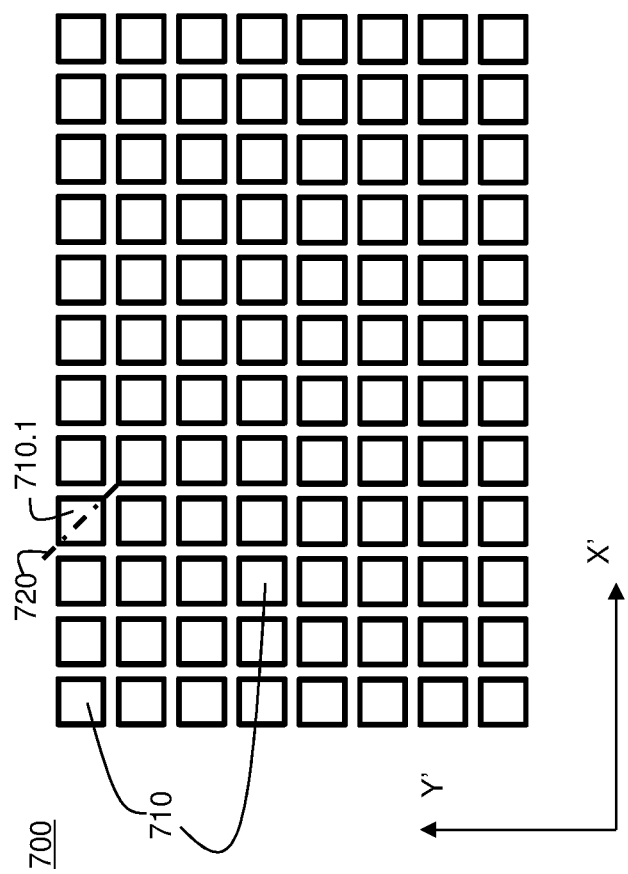
FIG. 7 schematically shows a top view of a two-dimensional array of controllable elements.

FIG. 7 schematically shows a top view of a two-dimensional array 700 of controllable elements, in particular mirrors 710, of which a position can be controlled, thereby controlling a deflection of a received portion of a radiation beam. in the embodiment as shown, the mirrors 700 are substantially rectangular mirrors arranged along an X'-direction and an Y'-direction. When used to pattern a substrate, as described above, the array 700 is typically oriented such that the mirrors that are arranged along the X'-direction provide an array of spots along the X-direction on the substrate, and the mirrors that are arranged along the Y'-direction provide an array of spots along the Y-direction on the substrate, as e.g. illustrated in FIGS. 4, 5 and 6.

In order to change the position of the mirrors 710, they are typically tilted. Typically, a tilting axis 720 of the mirrors, in general the controllable elements, is oriented along a diagonal of the elements, as illustrated in FIG. 7. As such, in order to bring a mirror 710.1 in a first position, e.g. an "ON" position, the mirror 710.1 is tilted about the tilting axis 720 about a first angle. Similarly, in order to bring the mirror 710.1 in a second position, e.g. an "OFF" position, the mirror 710.1 is tilted about the tilting axis 720 about a second angle, different from the first angle. It has been observed that the tilting angle about which the mirrors 710 of an array 700 are tilted in the "ON" position may not be the same for all mirrors. The tilting angles as obtained when the mirrors 710 are positioned in the "ON" position may thus be different. As a result, the portions of a radiation beam as deflected by the mirrors may be deflected in deviating directions, causing the pattern or radiation spots as obtained on a substrate to be irregular, as e.g. illustrated in FIG. 6.

It has been deduced by the inventor that the adverse effect of such an irregular pattern can be alleviated by adjusting the orientation of the array 700 of controllable elements 710 relative to the scanning direction. In particular, in accordance with the first aspect of the present invention, it is proposed to arrange the array of individually controllable elements in such manner that the tilting axis of the elements is substantially perpendicular to the scanning direction.

By orienting the tilting axis of the individually controllable elements of the array such that it is substantially perpendicular to the scanning direction of the substrate, variations of the tilting angle of the controllable elements will only cause irregularities of the pattern of radiation spots in the scanning direction. This is illustrated in FIG. 8.

Figure 8:
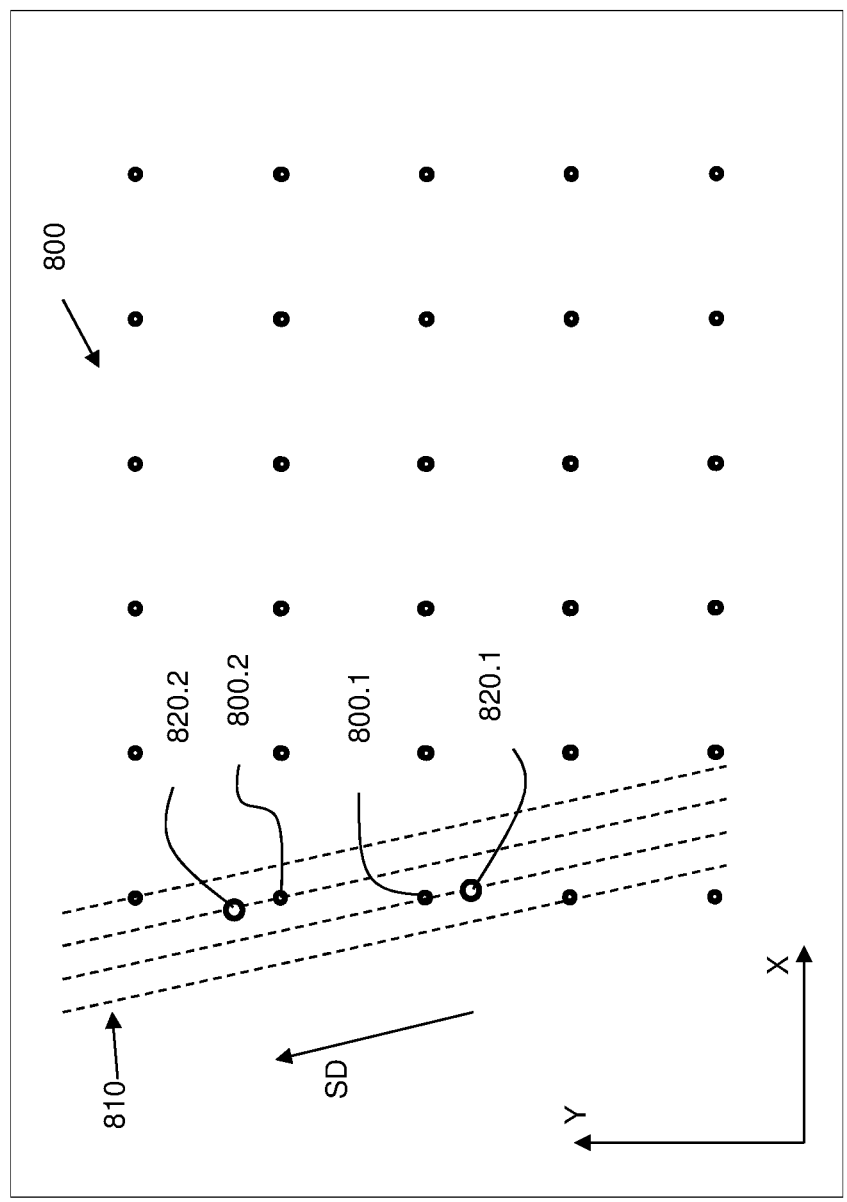
FIG. 8 illustrates an irregular pattern of radiation spots that is generated by having a tilting axis substantially perpendicular to the scanning direction.

FIG. 8 illustrates a pattern 800 of radiation spots that is generated by positioning a two-dimensional array of individually controllable elements in the "ON" position and projecting an imparted radiation beam, e.g. via a projection system or lens, onto a substrate. In the pattern as shown, the dots 800 represent the regular, desired pattern of radiation spots. It is further assumed that the tilting axis of the individually controllable elements is oriented in such manner that a variation of the tilting angle of an element deflecting a portion of a radiation beam causes a displacement of the corresponding radiation beam in the scanning direction SD. In the example as shown, a deviation in the tilting angle of the elements that generate radiation spots 800.1 and 800.2 is assumed. In particular, the actual position of the radiation spot 800.1 is at the location indicated by the circle 820.1, whereas the actual position of the radiation spot 800.2 is at the location indicated by the circle 820.2. As can be seen, the actual location of the radiation spots 820.1 and 820.2 still remains on the trajectories 810 associated with the regular grid pattern 800, the radiation spots 820.1 and 820.2 are only displaced, relative to the desired location, along the scanning direction. As a result, the positions of the trajectories of the different radiation spots are not altered, in contrast to the example shown in FIG. 6.

As such, the adverse effects described with reference to FIG. 6, will not occur for the pattern of FIG. 8.

By orienting the tilt angle of the array of individually controllable elements to be substantially perpendicular to the scanning direction, one obtains the effect that a tilt angle variation of a controllable element of the array of individually controllable elements will only cause a positional variation of the corresponding radiation spot in the scanning direction.

It can further be pointed out that, provided that the positional variations are known, e.g. the difference between position 800.1 and 820.1, the effects of a displacement of a radiation spot on the patterning or exposure process can be taken into account, by adjusting a timing or timing sequence of the corresponding controllable element.

The system according to the first aspect of the present invention may thus be characterised by comprising the following features:
 an array of individually controllable elements, the array being configured to impart a radiation beam so as to generate a patterned radiation beam by tilting the individually controllable elements between different positions about a tilting axis;
 a stage apparatus configured to hold a substrate and configured to scan a substrate across the patterned radiation beam in a scanning direction so as to expose the substrate to the patterned radiation beam,
 and whereby the tilting axis of the individually controllable elements is substantially perpendicular to the scanning direction.

As described above, with reference to FIGS. 4 to 8, the particular orientation of the tilting axis relative to the scanning direction allows to more accurately expose a substrate to a desired pattern.

With respect to the application of an array of individually controllable elements to impart a radiation beam and generate a patterned radiation beam, it can be pointed out that such arrays may be commercially available and e.g. comprise several hundreds of rows and columns of controllable elements. In case such an array is to be applied for exposing a substrate, whereby the patterned radiation beam is projected onto a substrate using a microlens array, the large number of available controllable elements may result in an undesirable large microlens array, assuming the microlens array to have a corresponding lens or lenslet for each controllable element of the array. As such, according to a second aspect of the present invention, a system for projecting a patterned radiation beam onto a substrate is proposed, which includes an array of individually controllable elements for generating a patterned radiation beam, and a projection system comprising a microlens array. In accordance with the second aspect of the invention, only a portion of the array of individually controllable elements is used for generating the patterned radiation beam. Such a portion may e.g. be applied as illustrated in FIGS. 4 and 8, to generate a desired pattern onto a substrate, by scanning the substrate, in a scanning direction SD, across the pattern of radiation spots as generated. By means of a step-and-scan approach, a desired area on a substrate may thus be provided with a desired pattern.

It can be pointed out that such an approach, whereby only part of the array of controllable elements is used, need not result in a reduced pixel rate for the exposure process. When only part of the array of controllable elements is used, the pattern rate, i.e. the rate at which the controllable elements are controlled, may be increased.

In an embodiment of the second aspect of the present invention, a system for projecting a patterned radiation beam onto a substrate is provided, whereby the system is configured to project at least two two-dimensional patterns of radiation spots onto the substrate simultaneously.

In such embodiment, the system, in particular the microlens array of the system may be configured to project a first two-dimensional pattern of radiation spots and a first two-dimensional pattern of radiation spots onto the substrate simultaneously, whereby the patterns are spaced apart in the scanning direction.

In such embodiment, two distinct portions of the substrate can be scanned simultaneously and provided with a desired pattern.

In such embodiment, a width of the first two-dimensional pattern in a direction perpendicular to the scanning direction can be selected to substantially corresponds to a width of the second two-dimensional pattern in a direction perpendicular to the scanning direction. In addition, a length of the first two-dimensional pattern in the scanning direction can substantially corresponds to a length of the second two-dimensional pattern in the scanning direction.

Figure 9:
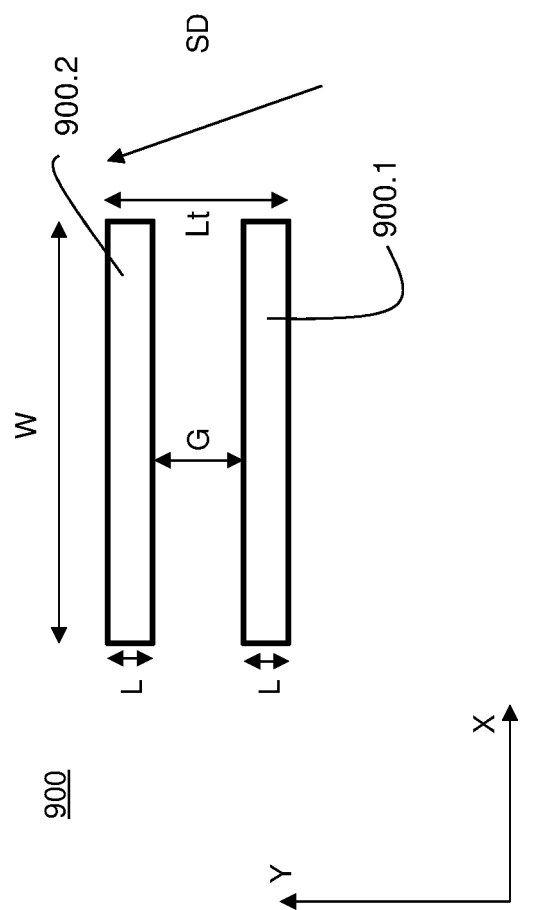
FIG. 9 schematically shows a top view of a pattern of radiation dots comprising a first two-dimensional pattern of radiation dots and a second two-dimensional pattern of radiation dots.

FIG. 9 schematically shows such a radiation pattern as can be applied onto a substrate.

FIG. 9 schematically shows a top view of a pattern of radiation dots 900 that can be generated using a system according to the invention, the pattern of radiation dots 900 comprising a first two-dimensional pattern 900.1 of radiation dots and a second two-dimensional pattern 900.2 of radiation dots. The patterns 900.1 and 900.2 may e.g. have a length L in the Y-direction and may be separated by a gap have a length G in the Y-direction.

The patterns 900.1 and 900.2 may e.g. comprise a plurality of rows of radiation dots, e.g. in a range from 50 to 200 rows, e.g. 100 rows. The gap length G may e.g. be equal to the length L or may be larger than L, e.g. a multiple of L. the gap length G may e.g. be twice the length L.

FIG. 9 further schematically shows a scanning direction SD along which a substrate can be displaced across the pattern 900 of radiation dots. By scanning the substrate across the pattern 900, an area of the substrate can be exposed to a desired radiation pattern. In an embodiment, the radiation pattern 900 may comprise more than two two-dimensional patterns, e.g. 5 or more patterns. The overall length Lt of the pattern 900 may span several cm, e.g. more than 5 cm. the width W of the pattern 900 may also span several cm, e.g. more than 10 cm.

In accordance with a third aspect of the present invention, there is provided a method of controlling a dose of radiation that is applied to a substrate. When a substrate is exposed to a pattern, it may be advantageous to accurately control the actual dose of radiation that is applied at specific locations, whereby the dose of radiation may e.g. vary substantially continuously between zero and a maximum value. In accordance with the method according to the third aspect of the invention, use is made of a modulated radiation beam and an array of individually controllable elements which can impart the modulated radiation beam.

Figure 10:
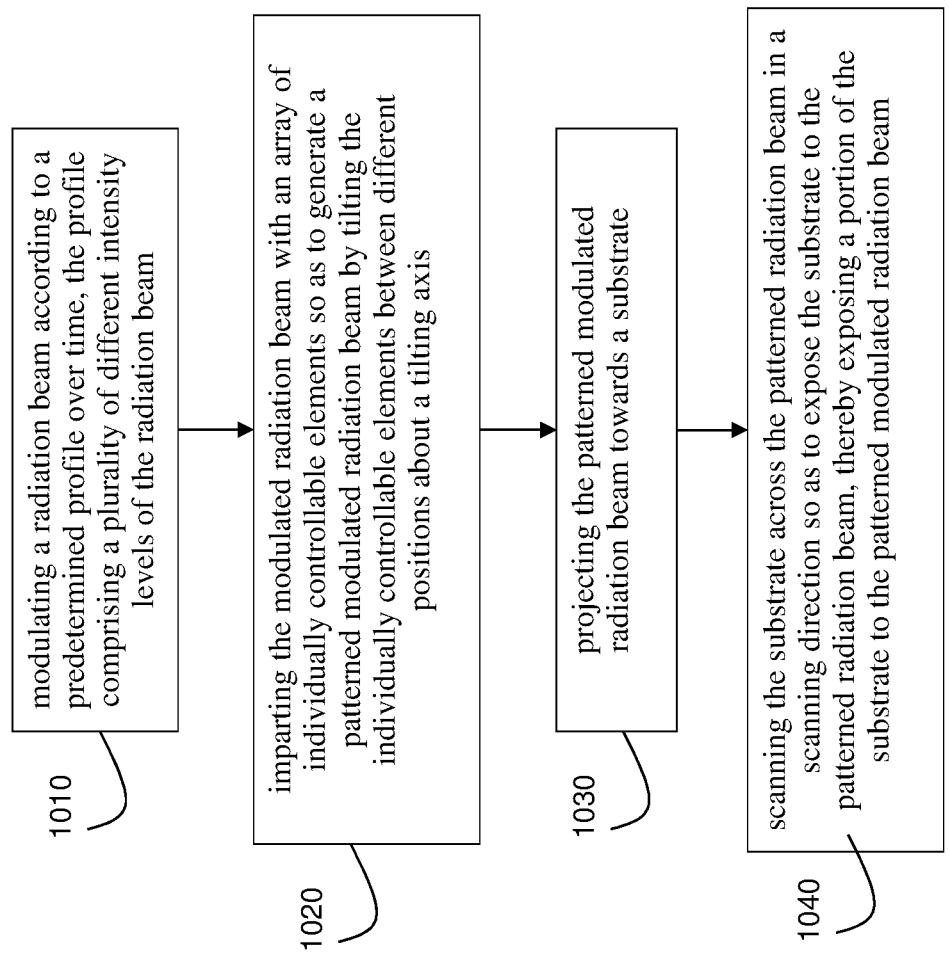
FIG. 10 schematically shows a flow-chart of a method according to the third aspect of the invention.

In particular, the method comprises the following steps, indicated in the flow-chart of FIG. 10:

In a first step 1010, the method of controlling a dose of radiation applied to a substrate comprises modulating a radiation beam according to a predetermined profile over time, the profile comprising a plurality of different intensity levels of the radiation beam. Within the meaning of the present invention, modulating a radiation beam according to a predetermined profile over time refers to modulating an intensity of a radiation beam according to a predetermine profile or pattern over time. Such a modulation may be repeated in a substantially continuous manner, i.e. whereby the profile or pattern is repeated.

In a second step, 1020, the method according to the invention comprises imparting the modulated radiation beam with an array of individually controllable elements so as to generate a patterned modulated radiation beam by tilting the individually controllable elements between different positions about a tilting axis. In the second step 1020 of the method according to the invention, the modulated radiation beam is transformed into a patterned modulated radiation beam; the array of individually controllable elements is used to selectively deflect the modulated radiation beam towards a substrate or a projection system, during the modulation according to the predetermined pattern over time. In accordance with the third aspect of the invention, the step of imparting the modulated radiation beam by the array of controllable elements 1020 comprises the step of determining, based on a required dose of radiation for a particular portion or location of the substrate and on the predetermined profile over time, a tilting sequence of an element of the array of controllable elements, so as to expose the portion of the substrate to a selection of the plurality of different intensity levels. As will be detailed further on, this allows to expose a particular location on the substrate with any desired combination of the available different intensity levels, thus enabling an accurate control of the radiation dose applied at said location.

In a third step, 1030, the method according to the invention comprises projecting the patterned modulated radiation beam towards a substrate.

In a fourth step 1040, the method according to the invention comprises scanning a substrate across the patterned radiation beam in a scanning direction so as to expose the substrate to the patterned radiation beam, thereby exposing a portion of the substrate to the patterned modulated radiation beam. because the portion of the substrate is exposed to a radiation beam that is both modulated, i.e. has a varying intensity according to a predetermined profile and imparted by the array of controllable elements, the radiation dose as received by the portion can be controlled in a detailed manner.

Figure 11:
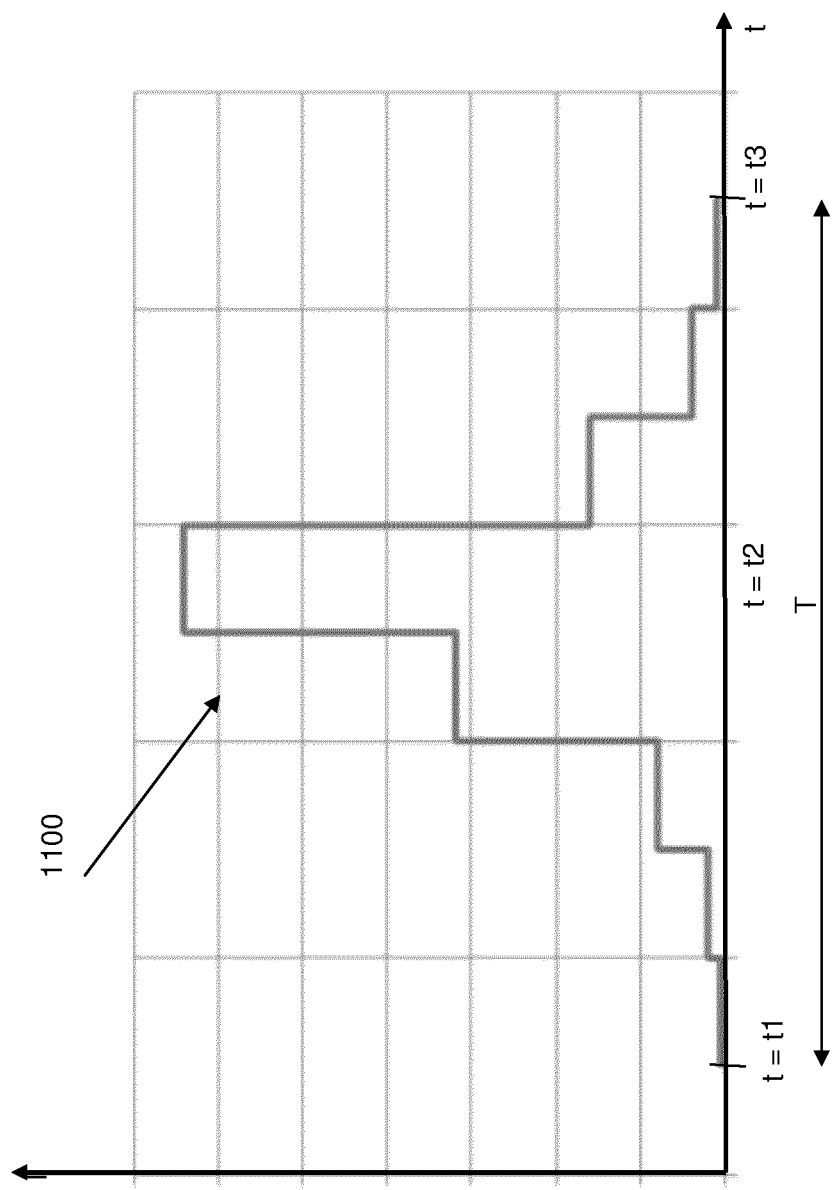
FIG. 11 schematically shows a profile or modulation profile which can be applied to a radiation beam.

As such, by a suitable control of the elements that impart the modulated radiation beam, one can control which portion of the modulated radiation beam is actually applied onto the substrate. As mentioned, during the step of imparting the modulated radiation beam by the array of controllable elements a tilting sequence of an element of the array of controllable elements, so as to expose the portion of the substrate to a selection of the plurality of different intensity levels. By doing so, the portion of the substrate will receive a selection of different intensity levels that are available in the profile at which the radiation beam is modulated. As a result, the radiation dose, i.e. the accumulated radiation to which the portion is subjected, can be controlled, in line with a desired radiation dose. This can be illustrated as follows:

FIG. 11 schematically shows a profile or modulation profile 1100 which can be applied to a radiation beam. The profile 1100 as schematically shown comprise 8 different intensity levels, applied over a period T in time. In the profile 1100 as shown, the highest intensity levels occur near the middle of the profile, the lowest intensity levels are arranged at the edges of the profile. It has been observed that the application of such an intensity profile enables a more accurate control of the applied dose.

When a radiation beam is modulated according to such a profile 1100 and a substrate is scanned across such a modulated radiation beam, a particular location on the substrate is subjected to a varying intensity, according to the depicted profile.

Figure 12:
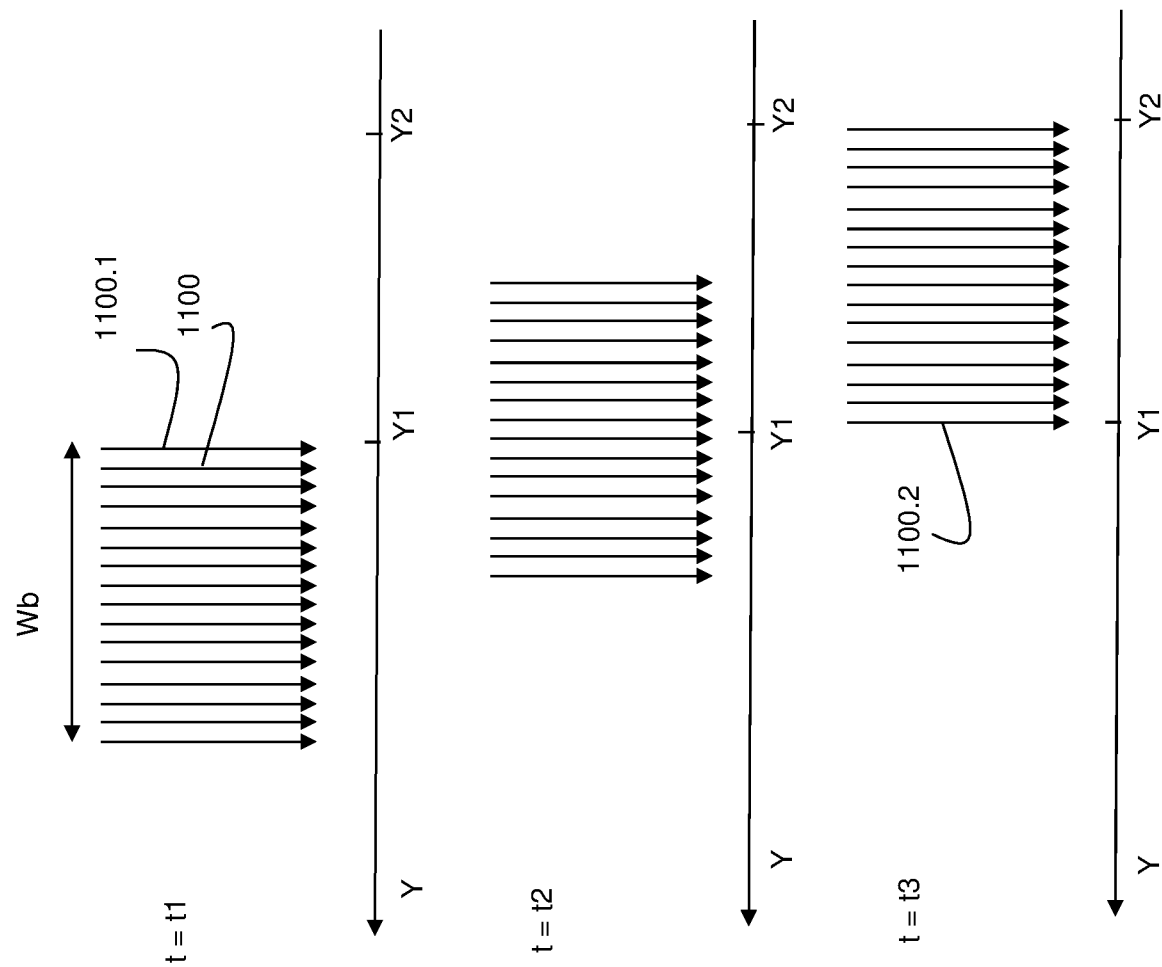
FIG. 12 schematically illustrates a radiation beam propagating along the Y-direction or scanning direction.

This is illustrated in FIG. 12, which schematically illustrates a radiation beam 1200 propagating along the Y-direction or scanning direction. FIG. 12 schematically illustrates the position of the radiation beam 1200 a three instants, t1, t2, t3 in time during a scanning of a substrate across the radiation beam 1200, the radiation beam 1200 having a width Wb in the scanning direction. In FIG. 12, Y1 indicates a particular location or portion of a substrate which is scanned or displaced underneath the radiation beam 1200. At t=t1, the location or portion Y1 of the substrate is aligned with the front side 1200.1 of the radiation beam 1200.

At t=t2, the location or portion Y1 of the substrate is substantially aligned with the middle of the radiation beam 1200.

At t=t3, the location or portion Y1 of the substrate is aligned with the back side 1200.2 of the radiation beam 1200, and a further location Y2 on the substrate is aligned with the front side of the radiation beam.

In case the radiation beam 1100 has been modulated in accordance with the modulation pattern shown in FIG. 11, the location Y1 will have been subjected to a radiation dose corresponding to a summation, or integration of the pattern over time.

Such a summation or integration of the modulated profile 1100 can be considered to correspond to the maximum radiation dose that can be applied to a particular portion or location on the substrate.

In case a lower radiation dose is required at a particular location, e.g. Y2, the method and system according to the third aspect of the invention enable to realise such a lower radiation dose by imparting the modulated radiation beam 1100 by an array of controllable elements and determining a tilting sequence of an element of the array of controllable elements, so as to expose the portion of the substrate to only a selection of the plurality of different intensity levels.

Assuming e.g. that the location Y2 as shown in FIG. 12 only requires half the maximum radiation dose. In order to do so, a tilting sequence of a controllable element, e.g. a mirror, can be determined such that, when the location Y2 is scanned across the radiation beam 1100, the radiation beam only impinges the substrate during selected portions of the period T. Phrased differently, the controllable element imparting the radiation beam scanning a particular location can be selectively be brought in an "ON" position or in an "OFF" position, thus exposing the particular location to only a selection of the available radiation or radiation levels, thus affecting the overall applied radiation dose at said location.

Figure 13A:
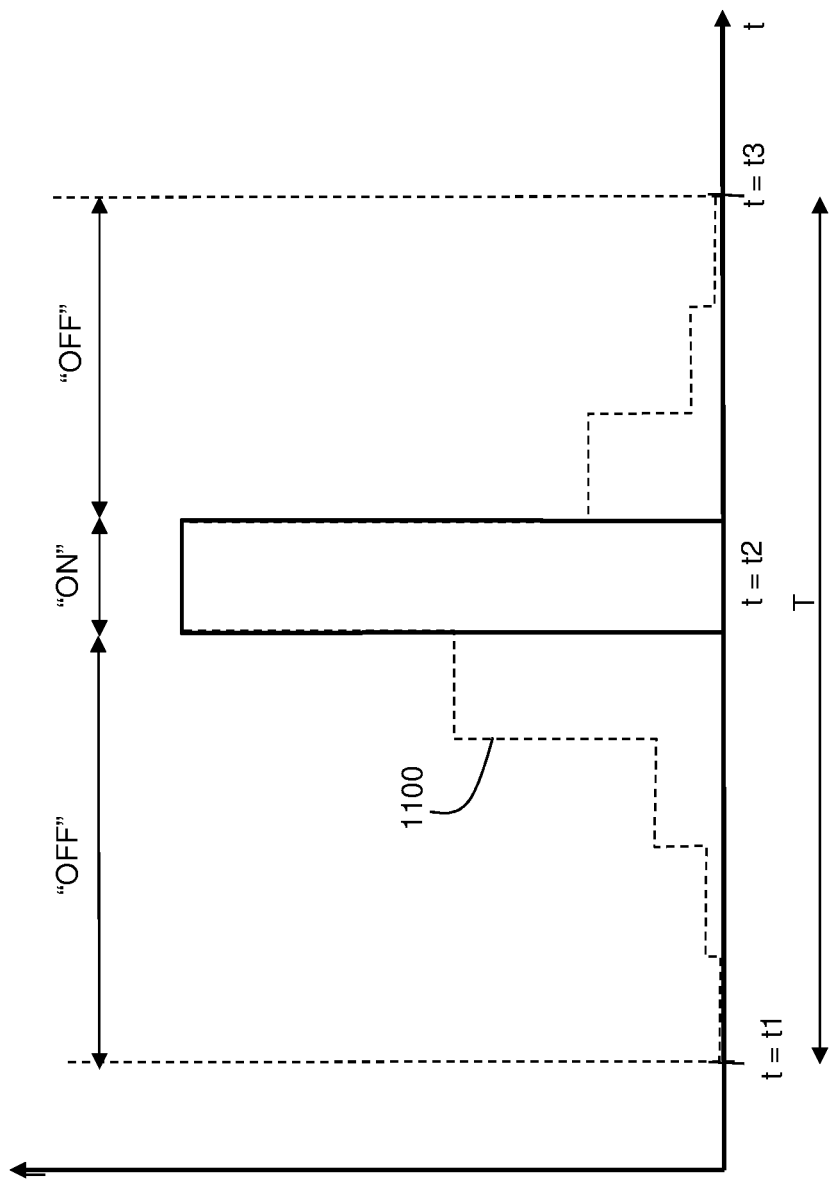
FIGS. 13a and 13b schematically shows two examples of tilting sequences of a controllable element, and the resulting radiation profile as applied.
Figure 13B:
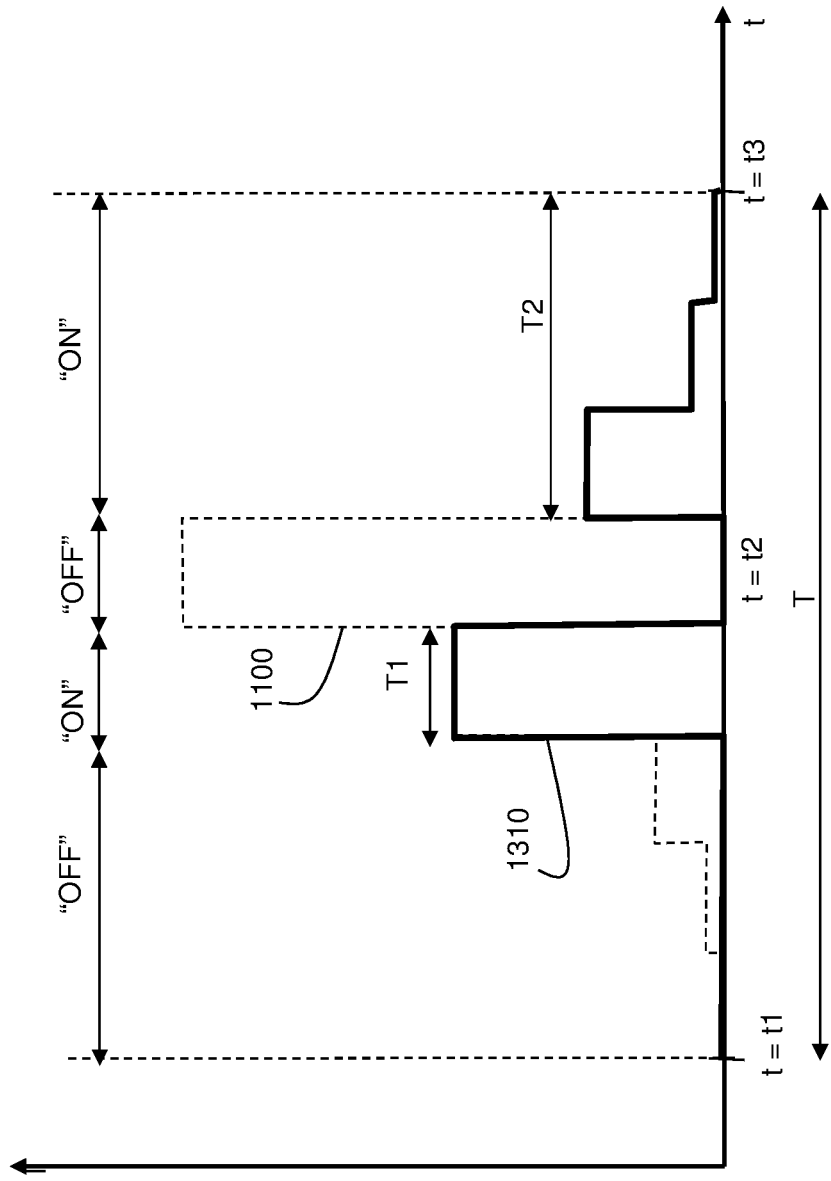

FIGS. 13a and 13b schematically shows two examples of tilting sequences of a controllable element, and the resulting radiation profile as applied.

In the example of FIG. 13a, the tilting sequence of the controllable element imparting the radiation beam is only in the "ON" state when the intensity is at its highest values. During the remaining portions of the period T, the element is in the "OFF" state and no radiation is projected onto the substrate. This results in an actual intensity profile 1300 resulting in a radiation dose that is approx. half the radiation dose of the profile 1100.

In the example of FIG. 13b, the controllable element is in the "ON" state during portions T1 and T2 of the period T and in the "OFF" state during the remaining parts of period T. This results in an actual intensity profile 1310 resulting in a radiation dose that is also approx. half the radiation dose of the profile 1100.

As will be appreciated by the skilled person, by a suitable selection of the different intensity levels, and tilting sequence for the controllable element, an accurate control of the applied radiation dose at a particular location can be obtained. The method according to the third aspect of the invention can be considered an example of so-called grayscaling. In accordance with the invention, the grayscaling is obtained by both modulating an intensity of a radiation beam and, during said modulation, controlling a controllable element, so as to selectively apply the available radiation intensities.

In order to ensure that each location on a substrate received a desired radiation, it is also important to ensure that any cross-talk between adjacent radiation spots is avoided as much as possible. Within the meaning of the present invention, cross-talk between radiation spots refers to radiation that is imparted by a particular controllable element and focused by a particular lenslet of microlens array towards a particular radiation spot but which partly affects the radiation level at an adjacent radiation spot.

As will be understood, the occurrence of cross-talk renders it more difficult to control an actual radiation dose as applied at a particular portion or location on a substrate.

It has been observed that, applying a conventional array of individually controllable elements, e.g. a programmable mirror array, in combination with a microlens array, an undesired level of cross-talk may still occur. In order to further reduce such an occurring cross-talk, a system according to the fourth aspect of the present invention can be applied. According to a fourth aspect of the present invention, there is provided a system for projecting a patterned radiation beam onto a substrate, the system comprising an array of individually controllable elements configured to impart a radiation beam so as to generate a patterned radiation beam by tilting the individually controllable elements between different positions about a tilting axis.

The system according to the invention further comprises a stage apparatus configured to hold a substrate and configured to scan a substrate across the patterned radiation beam in a scanning direction so as to expose the substrate to the patterned radiation beam. Such a stage apparatus can e.g. comprise one or more positioning devices for positioning the substrate relative to the patterned radiation beam. In order to do so the stage apparatus may also comprise a position measurement system providing a measurement signal characterising a relative position between the patterned radiation beam and the substrate. The system according to the fourth aspect of the invention further comprises a projection system configured to receive the patterned radiation beam, the projection system comprising:

a first microlens array
a second microlens array,
a pinhole array;

wherein the first microlens array is configured to receive the patterned radiation beam as generated by the array of individually controllable elements and project the patterned radiation beam onto the second microlens array, the second microlens array being configured to project the received patterned radiation beam onto the substrate, and wherein the pinhole array is arranged in an optical path of the patterned radiation beam between the first microlens array and the second microlens array. In accordance with the present invention, the pinhole array is configured to limit cross-talk between adjacent radiation spots projected onto the substrate.

Due to the application of the second microlens array and the pinhole array, the cross-talk between adjacent radiation spots can be substantially reduced.

Figure 14:
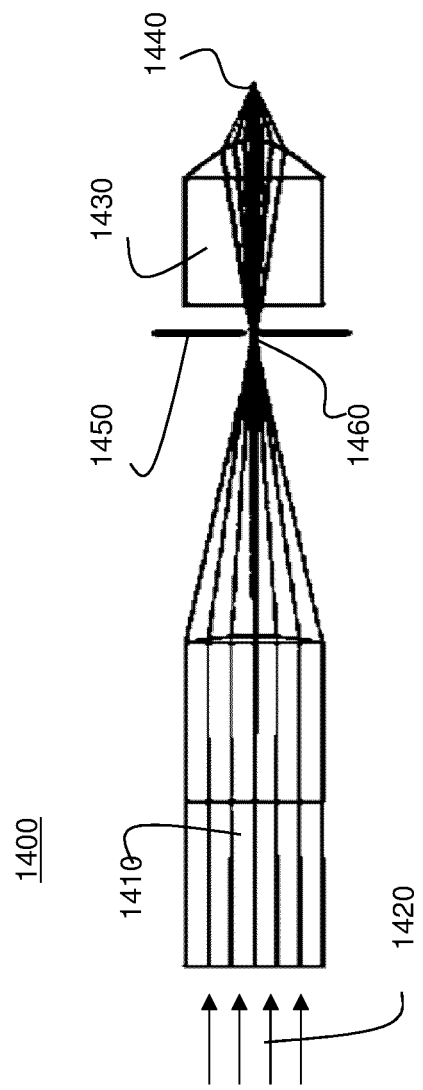
FIG. 14 schematically shows a portion of a projection system as can be applied in a system according to the fourth aspect of the invention.

FIG. 14 schematically shows a portion of a projection system 1400 as can be applied in a system according to the fourth aspect of the invention.

FIG. 14 schematically shows a first microlens 1410 configured to receive a portion 1420 of a patterned radiation beam, said portion e.g. being generated by a controllable element of an array of controllable elements. The first microlens 1410 as shown being configured to project the received portion 1420 of radiation towards a second microlens 1430, said second microlens 1430 being configured to focus the received radiation, thereby forming a radiation spot 1440. The part of the projection system 1400 as shown further comprises a pinhole 1450, which is part of a pinhole array, which is configured to provide a spatial filtering of the radiation emitted by the first microlens 1410. In the embodiment as shown, the pinhole 1450 is arranged near a focal point 1460 of the first microlens 1410.

The above described systems can advantageously be applied in a lithographic apparatus, in particular a maskless lithographic apparatus.

It can also be pointed out that the various aspects of the present invention may advantageously be combined.

In an embodiment, a controller is provided to control the individually addressable elements 102 and/or patterning device 104. The controller may control the power of the radiation emitted by one or more of the individually addressable elements. The controller may modulate the intensity of radiation emitted by one or more of the individually addressable elements. The controller may control/adjust intensity uniformity across all or part of an array of individually addressable elements. The controller may adjust the radiation output of the individually addressable elements to correct for imaging errors, e.g., etendue and optical aberrations (e.g., coma, astigmatism, etc.).

In an embodiment, patterning the radiation may be effected by controlling the patterning device 104 such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by providing a zero or significantly lower radiation intensity.

In practice, the radiation dose at the edges of the desired feature may not abruptly change from a given maximum dose to zero dose even if set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by providing radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate can only be set to two values (namely just a maximum value and a minimum value). In an embodiment, at least three different radiation intensity values can be projected, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. The method according to the third aspect of the invention can be considered a method enabling such grayscaling. The grayscaling method according to the invention applies a plurality of different radiation intensity levels which can be selectively applied at a particular location by applying a tilting or deflection sequence of the individually controllable elements of the patterning device. Also, grayscaling may be effected by grouping a plurality of programmable elements and/or deflectors and controlling the number of elements and/or deflectors within the group that are switched on or off at a given time.

In one example, the patterning device may have a series of states including: (a) a black state in which radiation provided is a minimum, or even a zero contribution to the intensity distribution of its corresponding pixel; (b) a whitest state in which the radiation provided makes a maximum contribution; and (c) a plurality of states in between in which the radiation provided makes intermediate contributions. The states are divided into a normal set, used for normal beam patterning/printing, and a compensation set, used for compensating for the effects of defective elements. The normal set comprises the black state and a first group of the intermediate states. This first group will be described as gray states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states is described as white states, it will be appreciated that this is simply to facilitate the distinction between the normal and compensatory exposure steps. The entire plurality of states could alternatively be described as a sequence of gray states, between black and white, selectable to enable grayscale printing.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point, as described above. For example, the radiation dose received by each point may alternatively or additionally be controlled by controlling the duration of the exposure of said point. As a further example, each point may potentially receive radiation in a plurality of successive exposures. The radiation dose received by each point may, therefore, be alternatively or additionally controlled by exposing said point using a selected subset of said plurality of successive exposures.

Further, while the discussion above regarding gray scaling focused on photolithography, similar concepts may be applied to the material deposition discussed herein. For example, power levels and/or flow rates may be controlled to provide gray scaling associated with the material deposition.

In order to form the pattern on the substrate, it is necessary to set the patterning device to the requisite state at each stage during the exposure process. Therefore control signals, representing the requisite states, must be transmitted to the patterning device. Desirably, the lithographic apparatus includes a controller that generates the control signals. The pattern to be formed on the substrate may be provided to the lithographic apparatus in a vector-defined format e.g., GDSII. In order to convert the design information into the control signals, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data (and then to a required radiation dose map (namely a required radiation dose profile across the substrate)) or to the required radiation dose map; converting a required radiation dose map into required radiation intensity values for each individually addressable element; and converting the required radiation intensity values for each individually addressable element into corresponding control signals.

In an embodiment, the control signals may be supplied to the individually addressable elements 102 and/or one or more other devices (e.g., a sensor) by wired or wireless communication. Further, signals from the individually addressable elements 102 and/or from one or more other devices (e.g., a sensor) may be communicated to the controller. In a similar manner to the control signals, power may be supplied to the individually addressable elements 102 or one or more other devices (e.g., a deflector and/or sensor) by wired or wireless means. For example, in a wired embodiment, power may be supplied by one or more lines, whether the same as the ones that carry the signals or different. A sliding contact arrangement may be provided to transmit power. In a wireless embodiment, power may be delivered by RF coupling.

While the previous discussion focused on the control signals supplied to the individually addressable elements 102 and/or one or more other devices (e.g., a deflector and/or a sensor), they should be understood to encompass in addition or alternatively, through appropriate configuration, transmission of signals from the individually addressable elements 102 and/or from one or more other devices (e.g., a sensor) to the controller. So, communication may be one-way (e.g., only to or from the individually addressable elements 102 and/or one or more other devices (e.g., a sensor)) or two-way (i.e., from and to the individually addressable elements 102 and/or one or more other devices (e.g., a sensor)).

In an embodiment, the control signals to provide the pattern may be altered to account for factors that may influence the proper supply and/or realization of the pattern on the substrate. For example, a correction may be applied to the control signals to account for the heating of one or more of the individually addressable elements 102, lenses, etc. Such heating may cause changed pointing direction of the individually addressable elements 102, lenses, etc., change in uniformity of the radiation, etc. In an embodiment, a measured temperature and/or expansion/contraction associated with an individually addressable element 102 and/or other element from, e.g., a sensor may be used to alter the control signals that would have been otherwise provided to form the pattern. So, for example, during exposure, the temperature of the individually addressable elements 102 may vary, the variance causing a change of the projected pattern that would be provided at a single constant temperature. Accordingly, the control signals may be altered to account for such variance. Similarly, in an embodiment, results from the alignment sensor and/or the level sensor 150 may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc.

In an embodiment, the change in the control signals may be determined based on theory of the physical/optical results on the desired pattern arising from the measured parameter (e.g., measured temperature, measured distance by a level sensor, etc.). In an embodiment, the change in the control signals may be determined based on an experimental or empirical model of the physical/optical results on the desired pattern arising from the measured parameter. In an embodiment, the change of the control signals may be applied in a feedforward and/or feedback manner.

In an embodiment, the lithographic apparatus may comprise a sensor 118 to measure a characteristic of the radiation that is or to be transmitted toward the substrate by one or more individually addressable elements 102. Such a sensor may be a spot sensor or a transmission image sensor. The sensor may be used to, for example, determine the intensity of radiation from an individually addressable element 102, uniformity of radiation from an individually addressable element 102, a cross-sectional size or area of the spot of radiation from an individually addressable element 102, and/or the location (in the X-Y plane) of the spot of radiation from an individually addressable element 102.

Although specific reference may be made in this text to the use of a lithographic apparatus in the manufacture of a specific device or structure (e.g. an integrated circuit or a flat panel display), it should be understood that the lithographic apparatus and lithographic method described herein may have other applications. Applications include, but are not limited to, the manufacture of integrated circuits, integrated optical systems, guidance and detection patterns for magnetic domain memories, flat panel displays, LCDs, OLED displays, thin film magnetic heads, micro-electromechanical devices (MEMS), micro-opto-electromechanical systems (MOEMS), DNA chips, packaging (e.g., flip chip, redistribution, etc.), flexible displays or electronics (which are displays or electronics that may be rollable, bendable like paper and remain free of deformities, conformable, rugged, thin, and/or lightweight, e.g., flexible plastic displays), etc. Also, for instance in a flat panel display, the present apparatus and method may be used to assist in the creation of a variety of layers, e.g. a thin film transistor layer and/or a color filter layer. Thus, a variation of the same apparatus herein could be used in the manufacture of various electronic and other devices or patterns, including, e.g., on flexible substrates, such as plastic or metal foil using e.g. roll-to-roll techniques and/or foil on a glass carrier.

The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A flat panel display substrate may be rectangular in shape. A lithographic apparatus designed to expose a substrate of this type may provide an exposure region which covers a full width of the rectangular substrate, or which covers a portion of the width (for example half of the width). The substrate may be scanned underneath the exposure region, while the patterning device synchronously provides the patterned beam. In this way, all or part of the desired pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The term "patterning device", used herein should be broadly interpreted as referring to any device that can be used to modulate the cross-section of a radiation beam such as to create a pattern in (part of) the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant by the array of individually addressable elements. This may be the case in an arrangement in which the eventual pattern formed on each part of the substrate is built up over a given period of time or a given number of exposures during which the pattern provided by the array of individually addressable elements and/or the relative position of the substrate changes. Generally, the pattern created on the target portion of the substrate will correspond to a particular functional layer in a device being created in the target portion, e.g., an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of an electronic devices (e.g., a computer), e.g., patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. The programmable mirror array may comprise a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. As an alternative, the filter may filter out the diffracted radiation, leaving the undiffracted radiation to reach the substrate. An array of diffractive optical MEMS devices may also be used in a corresponding manner. A diffractive optical MEMS device may comprise a plurality of reflective ribbons that may be deformed relative to one another to form a grating that reflects incident radiation as diffracted radiation. A further embodiment of a programmable mirror array employs a matrix arrangement of tiny mirrors, each of which may be individually tilted about an axis by applying a suitable localized electric field, or by employing piezoelectric actuation means. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. Nos. 5,296,891 and 5,523,193, and PCT Patent Application Publication Nos. WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually addressable elements, each controlled independently of each other. In such an arrangement, some or all of the arrays of individually addressable elements may have at least one of a common illumination system (or part of an illumination system), a common support structure for the arrays of individually addressable elements and/or a common projection system (or part of the projection system).

Where pre-biasing of features, optical proximity correction features, phase variation techniques and/or multiple exposure techniques are used, for example, the pattern "displayed" on the array of individually addressable elements may differ substantially from the pattern eventually transferred to a layer of or on the substrate. Similarly, the pattern eventually generated on the substrate may not correspond to the pattern formed at any one instant on the array of individually addressable elements. This may be the case in an arrangement in which the eventual pattern formed on each part of the substrate is built up over a given period of time or a given number of exposures during which the pattern on the array of individually addressable elements and/or the relative position of the substrate changes.

The projection system and/or illumination system may include various types of optical components, e.g., refractive, reflective, magnetic, electromagnetic, electrostatic or other types of optical components, or any combination thereof, to direct, shape, or control the beam of radiation.

The lithographic apparatus may be of a type having two (e.g., dual stage) or more substrate tables (and/or two or more patterning device tables) or one or more substrate tables in combination with another table not holding a substrate (e.g., a table for cleaning, and/or measurement, etc.). In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are used to increase the NA of projection system. The term "immersion" as used herein does not mean that a structure, e.g., a substrate, must be submerged in liquid, but rather only means that liquid is located between the projection system and the substrate during exposure.

Further, the apparatus may be provided with a fluid processing cell to allow interactions between a fluid and irradiated parts of the substrate (e.g., to selectively attach chemicals to the substrate or to selectively modify the surface structure of the substrate).

In an embodiment, the substrate has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color. In an embodiment, the substrate comprises a plastic foil on temporary glass carrier. This can include a coated layer of e.g. polyimide on a glass substrate, which is processed in similar fashion to a glass display, but where the glass is removed after processing using, e.g., a UV laser step, desirably after laminating the remaining foil with a protective plastic foil for increased robustness and ease of handling.

While, in an embodiment, the patterning device 104 is described and/or depicted as being above the substrate 114, it may instead or additionally be located under the substrate 114. Further, in an embodiment, the patterning device 104 and the substrate 114 may be side by side, e.g., the patterning device 104 and substrate 114 extend vertically and the pattern is projected horizontally. In an embodiment, a patterning device 104 is provided to expose at least two opposite sides of a substrate 114. For example, there may be at least two patterning devices 104, at least on each respective opposing side of the substrate 114, to expose those sides. In an embodiment, there may be a single patterning device 104 to project one side of the substrate 114 and appropriate optics (e.g., beam directing mirrors) to project a pattern from the single patterning device 104 onto another side of the substrate 114.

The embodiments may further be described using the following clauses:

1. Method of exposing a substrate by a patterned radiation beam, comprising:
   providing a radiation beam;
   imparting the radiation beam by an array of individually controllable elements;
   generating, from the radiation beam, a patterned radiation beam, by tilting the individually controllable elements between different positions about a tilting axis;
   projecting the patterned radiation beam towards a substrate;
   scanning a substrate across the patterned radiation beam in a scanning direction so as to expose the substrate to the patterned radiation beam, whereby the tilting axis of the individually controllable elements is substantially perpendicular to the scanning direction.

2. The method according to clause 1, whereby a tilt angle variation of a controllable element of the array of individually controllable elements causes only a positional variation in the scanning direction of a portion of the patterned radiation beam that is imparted by the controllable element and that is projected towards the substrate.

3. The method according to clause 2, wherein the individually controllable elements can be positioned in an ON position, thereby causing a portion of the radiation beam that is imparted by the element to be projected towards the substrate, and an OFF position, thereby causing the portion of the radiation beam that is imparted by the element to be projected away from the substrate.

4. The method according to clause 3, whereby a tilt angle variation of a controllable element of the array of individually controllable elements in the ON position causes a positional variation of the portion.
5. System for projecting a patterned radiation beam onto a substrate, the system comprising:
   an array of individually controllable elements, the array being configured to impart a radiation beam so as to generate a patterned radiation beam by tilting the individually controllable elements between different positions about a tilting axis;
   a stage apparatus configured to hold a substrate and configured to scan a substrate across the patterned radiation beam in a scanning direction so as to expose the substrate to the patterned radiation beam, and whereby the tilting axis of the individually controllable elements is substantially perpendicular to the scanning direction.
6. The system according to clause 5, wherein a tilt angle variation of a controllable element of the array of individually controllable elements causes only a positional variation in the scanning direction of a portion of the patterned radiation beam that is imparted by the controllable element and that is projected towards the substrate.
7. The system according to clause 5 or 6, wherein the array of individually controllable elements comprises a programmable mirror array such as a 2D tilting mirror array.
8. Lithographic apparatus comprising a system according to any of the clauses 5 to 7.
9. The lithographic apparatus according to clause 8, further comprising a radiation source configured to provide the radiation beam.
10. System for projecting a patterned radiation beam onto a substrate, the system comprising:
    an array of individually controllable elements, the array being configured to impart a radiation beam so as to generate a patterned radiation beam by tilting the individually controllable elements between different positions about a tilting axis;
    a stage apparatus configured to hold a substrate and configured to scan a substrate across the patterned radiation beam in a scanning direction so as to expose the substrate to the patterned radiation beam,
    a projection system comprising a microlens array, the microlens array being configured to:
      project a first two-dimensional pattern of radiation spots and a second two-dimensional pattern of radiation spots onto the substrate,
      whereby a width of the first two-dimensional pattern in a direction perpendicular to the scanning direction substantially corresponds to a width of the second two-dimensional pattern in a direction perpendicular to the scanning direction,
      whereby a length of the first two-dimensional pattern in the scanning direction substantially corresponds to a length of the second two-dimensional pattern in the scanning direction, and wherein the first two-dimensional pattern and the second two-dimensional pattern are spaced apart from each other in the scanning direction.
11. The system according to clause 10, wherein the individually controllable elements can be positioned in an ON position, thereby causing a portion of the radiation beam that is imparted by the element to be projected towards the substrate, and an OFF position, thereby causing the portion of the radiation beam that is imparted by the element to be projected away from the substrate.
12. The system according to clause 11, wherein the array of individually controllable elements comprises a first portion configured to generate the first two-dimensional pattern of radiation spots and a second portion configured to generate the second two-dimensional pattern of radiation spots.
13. Lithographic apparatus comprising a system according to any of the clauses 10 to 12.
14. Method of controlling a dose of radiation applied to a substrate, the method comprising:
    modulating a radiation beam according to a predetermined profile over time, the profile comprising a plurality of different intensity levels of the radiation beam;
    imparting the modulated radiation beam with an array of individually controllable elements so as to generate a patterned modulated radiation beam by tilting the individually controllable elements between different positions about a tilting axis;
    projecting the patterned modulated radiation beam towards a substrate;
    scanning a substrate across the patterned radiation beam in a scanning direction so as to expose the substrate to the patterned radiation beam, thereby exposing a portion of the substrate to the patterned modulated radiation beam;
    wherein the step of imparting the modulated radiation beam comprises:
    determining, based on a required dose of radiation for the portion of the substrate and on the predetermined profile over time, a tilting sequence of an element of the array of controllable elements, so as to expose the portion of the substrate to a selection of the plurality of different intensity levels.
15. The method according to clause 14, wherein a sum of the selection of the plurality of different intensity levels to which the portion is exposed substantially corresponds to the required dose of radiation.
16. The method according to clause 14 or 15, whereby the plurality of different intensity levels of the predetermined profile are arranged to have comparatively high intensity levels at or near a centre of the predetermined profile.
17. System for projecting a patterned radiation beam onto a substrate, the system comprising:
    an array of individually controllable elements, the array being configured to impart a radiation beam so as to generate a patterned radiation beam by tilting the individually controllable elements between different positions about a tilting axis;
    a radiation beam modulator configured to modulate a radiation beam according to a predetermined profile over time, the profile comprising a plurality of different intensity levels of the radiation beam;
    wherein the array of individually controllable elements is configured to impart the modulated radiation beam so as to generate a patterned modulated radiation beam by tilting the individually controllable elements between different positions about a tilting axis,
    wherein the system further comprises:
    a stage apparatus configured to hold a substrate and configured to scan a substrate across the patterned modulated radiation beam in a scanning direction so as to expose the substrate to the patterned radiation beam, thereby exposing a portion of the substrate to the patterned modulated radiation beam, a control unit, the control unit being configured to determine, based on a required dose of radiation for the portion of the substrate and on the predetermined profile over time, a tilting sequence of an element of the array of controllable elements, so as to expose the portion of the substrate to a selection of the plurality of different intensity levels.

18. Lithographic apparatus comprising a system according to clause 17.

19. System for projecting a patterned radiation beam onto a substrate, the system comprising:
   an array of individually controllable elements, the array being configured to impart a radiation beam so as to generate a patterned radiation beam by tilting the individually controllable elements between different positions about a tilting axis;
   a stage apparatus configured to hold a substrate and configured to scan a substrate across the patterned radiation beam in a scanning direction so as to expose the substrate to the patterned radiation beam,
   a projection system configured to receive the patterned radiation beam, the projection system comprising:
      a first microlens array
      a second microlens array,
      a pinhole array;
   wherein the first microlens array is configured to receive the patterned radiation beam and project the patterned radiation beam onto the second microlens array, the second microlens array being configured to project the received patterned radiation beam onto the substrate, wherein the pinhole array is arranged in an optical path of the patterned radiation beam between the first microlens array and the second microlens array, and wherein the pinhole array is configured to limit cross-talk between adjacent radiation spots projected onto the substrate.

In the description herein, the term "lens" should be understood generally to encompass any refractive, reflective, and/or diffractive optical element that provides the same function as the referenced lens. For example, an imaging lens may be embodied in the form of a conventional refractive lens having optical power, in the form of a Schwarzschild reflective system having optical power, and/or in the form of a zone plate having optical power. Moreover, an imaging lens may comprise non-imaging optics if the resulting effect is to produce a converged beam.

While specific embodiments have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

Moreover, although certain embodiments and examples have been described, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. In an embodiment, one or more features or aspects disclosed in U.S. patent application publication no. US 2011-0188016 and PCT patent application publication no. WO 2010/032224, the entire contents of U.S. patent application publication no. US 2011-0188016 and PCT patent application publication no. WO 2010/032224 incorporated herein by reference, may be combined with or substituted for one or more features or aspects disclosed herein.

The invention claimed is:

1. A method of exposing a substrate by a patterned radiation beam, the method comprising:
   imparting a radiation beam by an array of individually controllable elements;
   generating, from the radiation beam, a patterned radiation beam, by tilting the individually controllable elements between different positions about a tilting axis;
   projecting the patterned radiation beam towards a substrate; and
   scanning a substrate across the patterned radiation beam in a scanning direction so as to expose the substrate to the patterned radiation beam,
   wherein the tilting axis of the individually controllable elements is substantially perpendicular to the scanning direction, and
   wherein a tilt angle variation of a controllable element of the array of individually controllable elements causes substantially only a positional variation in the scanning direction of a portion of the patterned radiation beam that is imparted by the controllable element and that is projected towards the substrate.

2. The method according to claim 1, wherein an element of the individually controllable elements can be positioned in an ON position to cause a portion of the radiation beam that is imparted by the element to be projected towards the substrate, and an OFF position to cause the portion of the radiation beam that is imparted by the element to be projected away from the substrate.

3. The method according to claim 2, wherein a tilt angle variation of a controllable element of the array of individually controllable elements in the ON position causes a positional variation of the portion.

4. The method according to claim 1, further comprising controlling a dose of radiation applied to a substrate, the controlling comprising modulating the radiation beam according to a predetermined profile over time, the profile comprising a plurality of different intensity levels of the radiation beam; and
   wherein the imparting the radiation beam uses the modulated radiation beam and the imparting the modulated radiation beam comprises determining, based on a required dose of radiation for the portion of the substrate and on the predetermined profile over time, a tilting sequence of an element of the array of controllable elements; so as to expose the portion of the substrate to a selection of the plurality of different intensity levels.

5. The method according to claim 4, wherein a sum of the selection of the plurality of different intensity levels to which the portion is exposed substantially corresponds to the required dose of radiation.

6. The method according to claim 4, wherein the plurality of different intensity levels of the predetermined profile are arranged to have comparatively high intensity levels at or near a centre of the predetermined profile.

7. A system for projecting a patterned radiation beam onto a substrate, the system comprising:
an array of individually controllable elements, the array configured to impart a radiation beam so as to generate a patterned radiation beam by tilting the individually controllable elements between different positions about a tilting axis; and
a stage apparatus configured to hold a substrate and configured to scan a substrate across the patterned radiation beam in a scanning direction so as to expose the substrate to the patterned radiation beam,
wherein the tilting axis of the individually controllable elements is substantially perpendicular to the scanning direction, and
wherein a tilt angle variation of a controllable element of the array of individually controllable elements causes substantially only a positional variation in the scanning direction of a portion of the patterned radiation beam that is imparted by the controllable element and that is projected towards the substrate.

8. The system according to claim 7, wherein the array of individually controllable elements comprises a programmable mirror array.

9. The system according to claim 7, further comprising a radiation beam modulator configured to modulate the radiation beam according to a predetermined profile over time, the profile comprising a plurality of different intensity levels of the radiation beam, wherein the array of individually controllable elements is configured to impart the modulated radiation beam so as to generate a patterned modulated radiation beam by tilting the individually controllable elements between different positions about a tilting axis; and
a control unit, the control unit configured to determine, based on a required dose of radiation for a portion of the substrate and on the predetermined profile over time, a tilting sequence of an element of the array of controllable elements, so as to expose the portion of the substrate to a selection of the plurality of different intensity levels.

10. The system according to claim 9, wherein a sum of the selection of the plurality of different intensity levels to which the portion is exposed substantially corresponds to the required dose of radiation.

11. The system according to claim 9, wherein the plurality of different intensity levels of the predetermined profile are arranged to have comparatively high intensity levels at or near a centre of the predetermined profile.

12. A lithographic apparatus comprising the system according to claim 7.

13. The lithographic apparatus according to claim 12, further comprising a radiation source configured to provide the radiation beam.

14. A system for projecting a patterned radiation beam onto a substrate, the system comprising:
an array of individually controllable elements, the array configured to impart a radiation beam so as to generate a patterned radiation beam by tilting the individually controllable elements between different positions about a tilting axis;
a radiation beam modulator configured to modulate a radiation beam according to a predetermined profile over time, the profile comprising a plurality of different intensity levels of the radiation beam, wherein the array of individually controllable elements is configured to impart the modulated radiation beam so as to generate a patterned modulated radiation beam by tilting the individually controllable elements between different positions about a tilting axis;
a stage apparatus configured to hold a substrate and configured to scan a substrate across the patterned modulated radiation beam in a scanning direction so as to expose a portion of the substrate to the patterned modulated radiation beam; and
a control unit configured to determine, based on a required dose of radiation for the portion of the substrate and on the predetermined profile over time, a tilting sequence of an element of the array of controllable elements, so as to expose the portion of the substrate to a selection of the plurality of different intensity levels.

15. The system according to claim 14, wherein a sum of the selection of the plurality of different intensity levels to which the portion is exposed substantially corresponds to the required dose of radiation.

16. The system according to claim 14, wherein the plurality of different intensity levels of the predetermined profile are arranged to have comparatively high intensity levels at or near a centre of the predetermined profile.

17. The system according to claim 14, wherein a tilt angle variation of a controllable element of the array of individually controllable elements causes only a positional variation in the scanning direction of a portion of the patterned radiation beam that is imparted by the controllable element and that is projected towards the substrate.

18. The system according to claim 14, wherein the array of individually controllable elements comprises a programmable mirror array.

19. A lithographic apparatus comprising the system according to claim 14.

20. The lithographic apparatus according to claim 19, further comprising a radiation source configured to provide the radiation beam.

* * * * *